United States Patent
Suwa et al.

(10) Patent No.: US 10,715,192 B2
(45) Date of Patent: Jul. 14, 2020

(54) SIGNAL PROCESSING APPARATUS, SIGNAL PROCESSING METHOD, AND STORAGE MEDIUM

(71) Applicant: CANON KABUSHIKI KAISHA, Tokyo (JP)

(72) Inventors: Tetsuya Suwa, Yokohama (JP); Tomokazu Ishikawa, Yokohama (JP); Wakako Tanaka, Inagi (JP); Shinjiro Hori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 519 days.

(21) Appl. No.: 15/470,023

(22) Filed: Mar. 27, 2017

(65) Prior Publication Data

US 2017/0288713 A1 Oct. 5, 2017

(30) Foreign Application Priority Data

Mar. 31, 2016 (JP) .................................. 2016-070728

(51) Int. Cl.
*H04B 1/10* (2006.01)
*H04N 1/50* (2006.01)
(Continued)

(52) U.S. Cl.
CPC .............. *H04B 1/10* (2013.01); *G01R 23/16* (2013.01); *G01R 29/26* (2013.01); *G06K 9/0051* (2013.01); *G06K 9/0055* (2013.01); *G06K 9/036* (2013.01); *G06T 5/002* (2013.01); *G10L 21/0208* (2013.01); *H04B 17/336* (2015.01); *H04B 17/345* (2015.01); *H04N 1/409* (2013.01); *H04N 1/504* (2013.01)

(58) Field of Classification Search
CPC ........ H04B 1/10; H04B 17/336; H04N 1/409; H04N 1/504; G01L 21/0208; G01R 29/26; G06T 5/002
See application file for complete search history.

(56) References Cited

U.S. PATENT DOCUMENTS

2007/0171964 A1 7/2007 Chen et al.

FOREIGN PATENT DOCUMENTS

| CN | 2872497 Y | 2/2007 |
| CN | 101329197 A | 12/2008 |

(Continued)

OTHER PUBLICATIONS

Liu et al., Binary Image Enhancement Based on Aperiodic Stochastic Resonance, Nov. 23, 2015, IET Image Processing, vol. 9, Issue 12, pp. 1033-1038 (Year: 2015).*

(Continued)

*Primary Examiner* — Toan M Le
(74) *Attorney, Agent, or Firm* — Venable LLP

(57) ABSTRACT

A signal processing apparatus includes a unit configured to generate noise cut data by deducting a predetermined noise value from values of respective signals constituting input data and a stochastic resonance processing unit configured to subject the noise cut data to a predetermined stochastic resonance processing. The predetermined stochastic resonance processing is processing to output, in a method of synthesizing a result of parallelly performing steps of adding new noise to the noise cut data to subject the resultant data to a binary processing, a value obtained in a case where the parallel number is infinite.

15 Claims, 20 Drawing Sheets

(51) Int. Cl.

| | |
|---|---|
| *H04N 1/409* | (2006.01) |
| *G06K 9/00* | (2006.01) |
| *G06K 9/03* | (2006.01) |
| *H04B 17/336* | (2015.01) |
| *H04B 17/345* | (2015.01) |
| *G01R 23/16* | (2006.01) |
| *G01R 29/26* | (2006.01) |
| *G06T 5/00* | (2006.01) |
| *G10L 21/0208* | (2013.01) |

(56) References Cited

FOREIGN PATENT DOCUMENTS

| CN | 201548618 U | 8/2010 |
|---|---|---|
| CN | 104298878 A | 1/2015 |
| JP | 2008-009549 A | 1/2008 |
| JP | 2012-175371 A | 9/2012 |
| JP | 2015-119417 A | 6/2015 |

OTHER PUBLICATIONS

Abstract of Liu et al., Nov. 23, 2015, 1 pp. (Year: 2015).*
Bruno Andò, et al., "Stochastic Resonance Theory and Applications," Kluwer Academic Publishers, 2000, pp. 1-220.
European Search Report issued in corresponding European Application No. 17162492.7 dated Jun. 22, 2017.
Copending, unpublished U.S. Appl. No. 15/470,024, dated Mar. 27, 2017, to Tomokazu Ishikawa, et al.
J.J. Collins, et al., "Stochastic resonance without tuning," Nature (UK), vol. 376, Jul. 20, 1995, pp. 236-238.
Apr. 21, 2020 Japanese Official Action in Japanese Patent Appln. No. 2016-070728.
Koji Kashihara, et al., "A Method for Accurate Estimation of Venous Shapes from Small Picture Signals," The Institute of Electronics, Information and Communication Engineers, IEICE Technical Report, vol. 111, No. 258, 2011, pp. 1-8.
May 7, 2020 Chinese Official Action in Chinese Patent Appln. No. 201710197716.9.

* cited by examiner

| DATA TYPE | CORRELATION COEFFICIENT |
|---|---|
| S(x) | 0.6756 |
| j(x):ADDITION NOISE INTENSITY 120 | 0.9187 |
| j(x):ADDITION NOISE INTENSITY 160 | 0.7375 |

FIG.15

| DATA TYPE | CORRELATION COEFFICIENT |
|---|---|
| S(x) | 0.6756 |
| j(x):ADDITION NOISE INTENSITY 120 | 0.8912 |
| j(x):ADDITION NOISE INTENSITY 160 | 0.8477 |

SIGNAL PROCESSING APPARATUS, SIGNAL PROCESSING METHOD, AND STORAGE MEDIUM

BACKGROUND OF THE INVENTION

Field of the Invention

The present invention relates to a signal processing apparatus and a signal processing method by which a detection target signal is extracted from an input signal in which the detection target signal is buried in noise.

Description of the Related Art

In order to extract a detection target signal from an input signal buried in noise, a stochastic resonance phenomenon is useful. The stochastic resonance phenomenon is a phenomenon in which an input signal buried in noise is further added with noise and the resultant signal is subsequently subjected to nonlinear processing to thereby emphasize a detection target signal. However, in such a stochastic resonance phenomenon, a correlation coefficient used as an evaluation value showing the performance of the detection result changes depending on the strength of added noise as shown in FIG. 1. In the case of FIG. 1, the correlation coefficient is maximum at a noise strength 30. Specifically, the noise strength is desirably tuned because of the existence of the noise strength optimal for the realization of the maximum detection accuracy.

J. J. Collins, Carson C. Chow and Thomas T. Imhoff, "Stochastic resonance without tuning", NATURE, (UK), 20 Jul. 1995, vol. 376, pp. 236-238 (hereinafter referred to as Non-Patent Document 1) discloses a configuration as shown in FIG. 2 in which an input signal I(x) is branched to a plurality of pieces and different noises are added to each of the pieces and are subjected to a nonlinear processing to further synthesize the outputs thereof to thereby detect a detection target signal at a stable accuracy. Non-Patent Document 1 describes that the increase of the branches allows the correlation coefficient to be stabilized regardless of the strength, which eliminates the peak as shown in FIG. 1, thus resulting in the elimination of the need to tune the noise strength.

Japanese Patent Laid-Open No. 2012-175371 discloses a processing to synthesize a plurality of synthesized signal system columns generated based on any of a desired signal system column and an interference signal system column included in a reception signal system column with the reception signal system column to use a stochastic resonance phenomenon to emphasize a desired signal system column.

SUMMARY OF THE INVENTION

By the way, in recent years, the extraction of a detection target signal using the stochastic resonance phenomenon as described above may be used for product inspection for example. For example, a manufactured product can be imaged and predetermined noise is added to the resultant image data to subject the data to nonlinear processing, thereby extracting a singular portion such as a flaw existing in a product. Then, by providing such an extraction step, a step of pop-upping the extracted singular portion, and a step of allowing an inspector to confirm the pop-upped image and finally determine, the inspection time can be significantly reduced and the inspection accuracy can be improved when compared with a case where the product is only determined through the visual inspection by the inspector.

Furthermore, the application of the singular portion extraction mechanism as described above is not limited to the inspection step in a production site but can be used for a product itself. Specific examples include a configuration in which, in a case where an ejecting failure occurs in a personal printer, an image printed by the personal printer is imaged and the resultant image data is subjected to the stochastic resonance processing, thereby a defective portion can be extracted automatically. Regardless of the product inspection at the shipment from a plant or the image inspection after the delivery of the product, the singular portion extraction processing in the inspection step must be carried out by a relatively-simple configuration and a simple processing with a high accuracy and a high speed.

However, if the above inspection step uses Non-Patent Document 1 or the publication of Japanese Patent Laid-Open No. 2012-175371 in order to sufficiently increase the effect thereof, i.e., the robustness against the noise strength, many synthesis circuits or nonlinear circuits are required, which causes a concern of a complicated processing, an increased processing time, or an apparatus having a higher price.

The present invention has been made in order to solve the above disadvantage. It is an objective of the invention to provide a signal processing apparatus and a signal processing method by which a detection target signal can be accurately extracted from an input signal in a short period of time at stable reliability.

According to a first aspect of the present invention, there is provided a signal processing apparatus, comprising: an acquisition unit configured to acquire input data; a unit configured to generate noise cut data by deducting a predetermined noise value from values of respective signals constituting the input data; a stochastic resonance processing unit configured to subject the noise cut data to a predetermined stochastic resonance processing to thereby generate stochastic resonance data; and an output unit configured to output the result of the predetermined stochastic resonance processing, wherein the predetermined stochastic resonance processing is processing to output, in a method of synthesizing a result of parallelly performing steps of adding new noise to the noise cut data to subject the resultant data to a binary processing, a value obtained in a case where the parallel number is infinite.

According to a second aspect of the present invention, there is provided a signal processing apparatus, comprising: an acquisition unit configured to acquire input data; a unit configured to generate noise cut data by deducting a predetermined noise value from values of respective signals constituting the input data; a stochastic resonance processing unit configured to subject the input data to a predetermined stochastic resonance processing to subsequently multiply the noise cut data to thereby generate stochastic resonance data; and an output unit configured to output the result of the predetermined stochastic resonance processing, wherein the predetermined stochastic resonance processing is processing to output, in a method of synthesizing a result of parallelly performing steps of adding new noise to the input data to subject the resultant data to a binary processing, a value obtained in a case where the parallel number is infinite.

According to a third aspect of the present invention, there is provided a signal processing method, comprising: an acquisition step of acquiring input data; a step of generating noise cut data by deducting a predetermined noise value from values of respective signals constituting the input data;

a stochastic resonance processing step of subjecting the noise cut data to a predetermined stochastic resonance processing to thereby generate stochastic resonance data; and an output step of outputting the result of the predetermined stochastic resonance processing, wherein the predetermined stochastic resonance processing is a processing to output, in a method of synthesizing a result of parallelly performing steps of adding new noise to the noise cut data to subject the resultant data to a binary processing, a value obtained in a case where the parallel number is infinite.

According to a fourth aspect of the present invention, there is provided a non-transitory computer-readable storage medium which stores a program for causing a computer to execute the signal processing method, the signal processing method comprising: an acquisition step of acquiring input data; a step of generating noise cut data by deducting a predetermined noise value from values of respective signals of the input data; a stochastic resonance processing step of subjecting the noise cut data to a predetermined stochastic resonance processing to thereby generate stochastic resonance data; and an output step of outputting the result of the predetermined stochastic resonance processing, wherein: the predetermined stochastic resonance processing is a processing to output, in a method of synthesizing a result of parallelly performing steps of adding new noise to the noise cut data to subject the resultant data to a binary processing, a value obtained in a case where the parallel number is infinite.

Further features of the present invention will become apparent from the following description of exemplary embodiments (with reference to the attached drawings).

BRIEF DESCRIPTION OF THE DRAWINGS

FIG. 15 illustrates a correlation coefficient value obtained by subjecting the processing target signal S(x) to various kind of processing;

FIG. 19 illustrates the correlation coefficient value obtained by subjecting the processing target signal S(x) to various kind of processing.

DESCRIPTION OF THE EMBODIMENTS

FIGS. 3A to 3D illustrate the illustrative mode of an image processing apparatus 1 that can be used as a signal processing apparatus of the present invention. The image processing apparatus of the present invention is used to subject image data to a popup processing to allow a user to more easily recognize the white stripe (stripe-like unevenness) in a printed image for example or a processing for the determination by the apparatus itself. The image processing apparatus of the present invention can take various system forms.

Figure 3A:
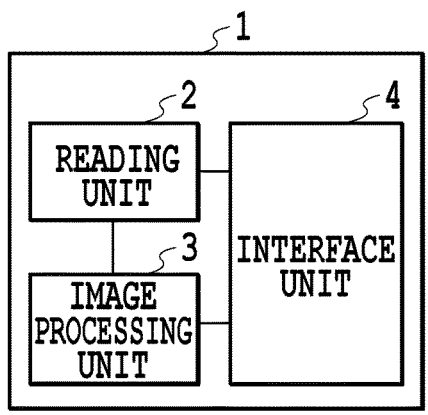
FIGS. 3A to 3D show an illustrative mode of an image processing apparatus that can be used in the present invention.

FIG. 3A illustrates an embodiment in which the image processing apparatus 1 includes a reading unit 2. For example, this mode corresponds to a case where a sheet on which a predetermined image is printed by the inkjet printing apparatus is placed on the reading base of the reading unit 2 in the image processing apparatus 1 and is imaged by an optical sensor for example and the image data is processed by an image processing unit 3. The image processing unit 3 includes a CPU or an image processing accelerator providing a processing having a higher speed than that of the CPU and controls the reading operation by the reading unit 2 and subject received image data to a predetermined inspection processing.

Figure 3B:
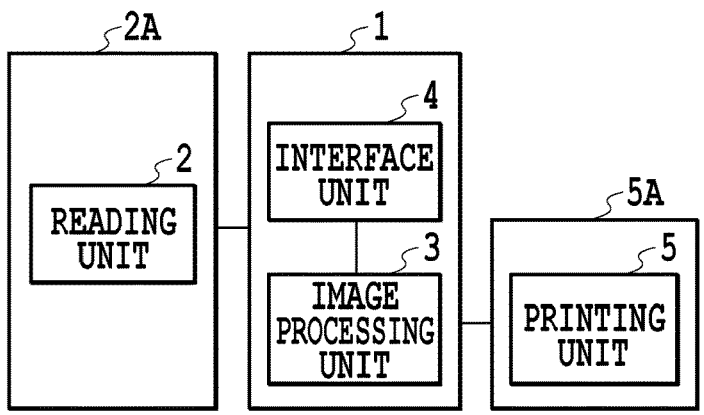

FIG. 3B illustrates an embodiment in which the image processing apparatus 1 is externally connected to a reading apparatus 2A including the reading unit 2. For example, this corresponds to a system in which a scanner is connected to a PC for example. A general connection method such as USB, GigE, or CameraLink may be used. The image data read by the reading unit 2 is provided via an interface 4 to the image processing unit 3. The image processing unit 3 subjects the received image data to a predetermined inspection processing. In the case of this embodiment, the image processing apparatus 1 may be further externally connected to a printing apparatus 5A including a printing unit 5.

Figure 3C:
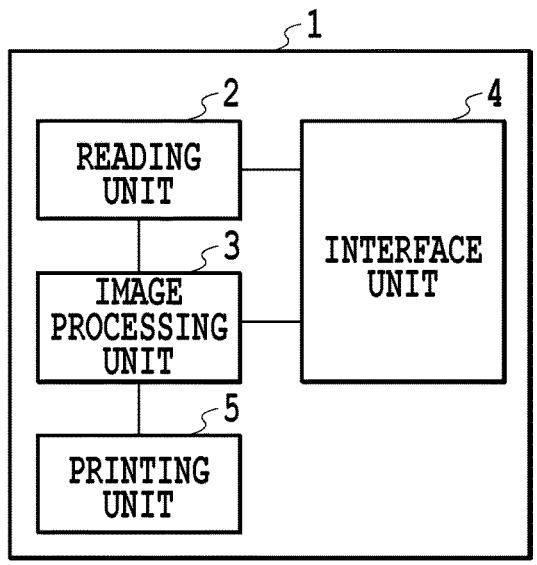

FIG. 3C illustrates an embodiment in which the image processing apparatus 1 includes the reading unit 2 and the printing unit 5. This corresponds to a complex machine including a scanner function, a printer function, and an image processing function for example. The image processing unit 3 controls all operations such as the printing operation in the printing unit 5, the reading operation in the reading unit 2, and the inspection processing to an image read by the reading unit 2.

Figure 3D:
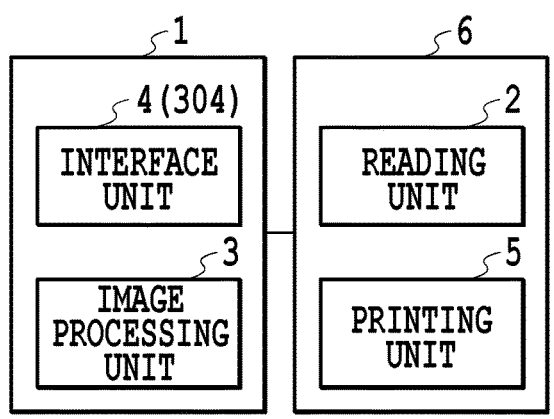

FIG. 3D illustrates an embodiment in which a complex machine 6 including the reading unit 2 and the printing unit 5 is externally connected to the image processing apparatus 1. This corresponds to a system in which a complex machine including both of a scanner function and a printer function is connected to a PC for example. The image processing apparatus 1 of the present invention also can take any of the embodiments of FIGS. 3A to 3D. However, the following section will describe an embodiment of the invention via an example of the image inspection apparatus using the embodiment of FIG. 3D.

First Embodiment

Figure 4:
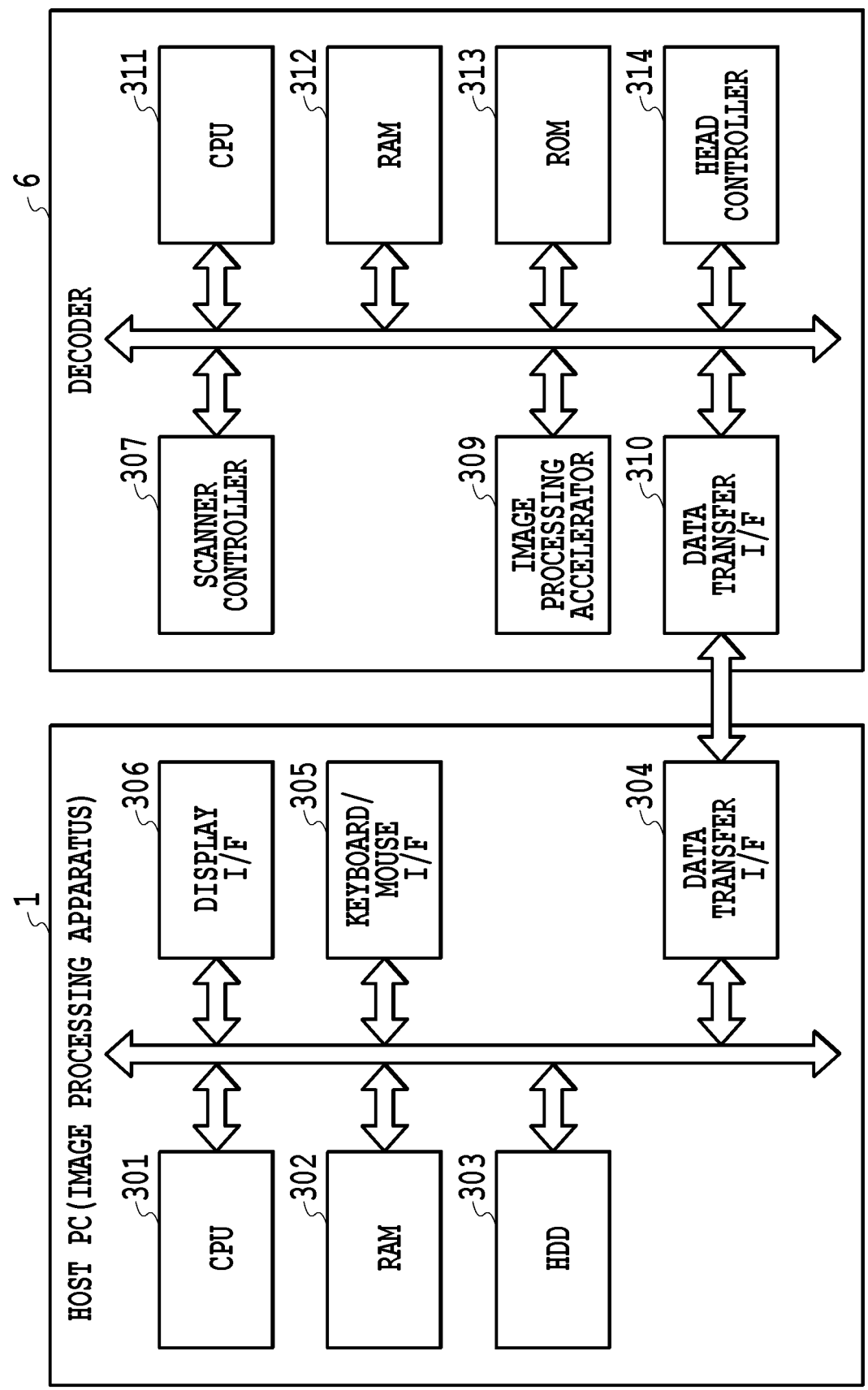
FIG. 4 is a block diagram to explain the configuration of the control in the first embodiment.

FIG. 4 is a block diagram for explaining the control configuration in the embodiment of FIG. 3D. The image processing apparatus 1 as a signal processing apparatus consists of a host PC for example. A CPU 301 executes various kinds of processing while using a RAM 302 as a work area in accordance with a program retained in an HDD 303. For example, the CPU 301 generates image data that can be printed by the complex machine 6 based on a command received from a user via a keyboard/mouse I/F 305 or a program retained by the HDD 303 and transfers this to the complex machine 6. The CPU 301 subjects the image data received from the complex machine 6 via a data transfer I/F 304 to predetermined processing based on the program stored in the HDD to display the result or various pieces of information on a not-shown display via a display I/F 306. Image data I(x), which is a target of the stochastic resonance processing of this embodiment as described later, is received from the complex machine 6 via the data transfer I/F 304.

On the other hand, in the complex machine 6, a CPU 311 executes various kinds of processing while using a RAM 312 as a work area based on a program retained by a ROM 313. The complex machine 6 includes an image processing accelerator 309 for performing high-speed image processing, a scanner controller 307 for controlling the reading unit 2, and a head controller 314 for controlling the printing unit 5.

The image processing accelerator 309 is hardware that can execute image processing at a higher speed than the CPU 311. The image processing accelerator 309 is activated by allowing the CPU 311 to write parameters required for the image processing and data to the predetermined address of the RAM 312. After the above parameters and data are read, the data is subjected to predetermined image processing. However, the image processing accelerator 309 is not an indispensable element. Thus, similar processing can be executed by the CPU 311.

The head controller 314 supplies printing data to a printing head 100 provided in the printing unit 5 and controls the printing operation of the printing head 100. The head controller 314 is activated by allowing the CPU 311 to write printing data that can be printed by the printing head 100 and control parameters to a predetermined address of the RAM 312 and executes ejecting operations based on the printing data.

The scanner controller 307 outputs, while controlling the individual reading elements arranged in the reading unit 2, RGB brightness data obtained therefrom to the CPU 311. The CPU 311 transfers the resultant RGB brightness data via the data transfer I/F 310 to the image processing apparatus 1. The data transfer I/F 304 of the image processing apparatus 1 and the data transfer I/F 310 of the complex machine 6 can be connected by a USB, IEEE1394, or LAN for example.

Figure 5:
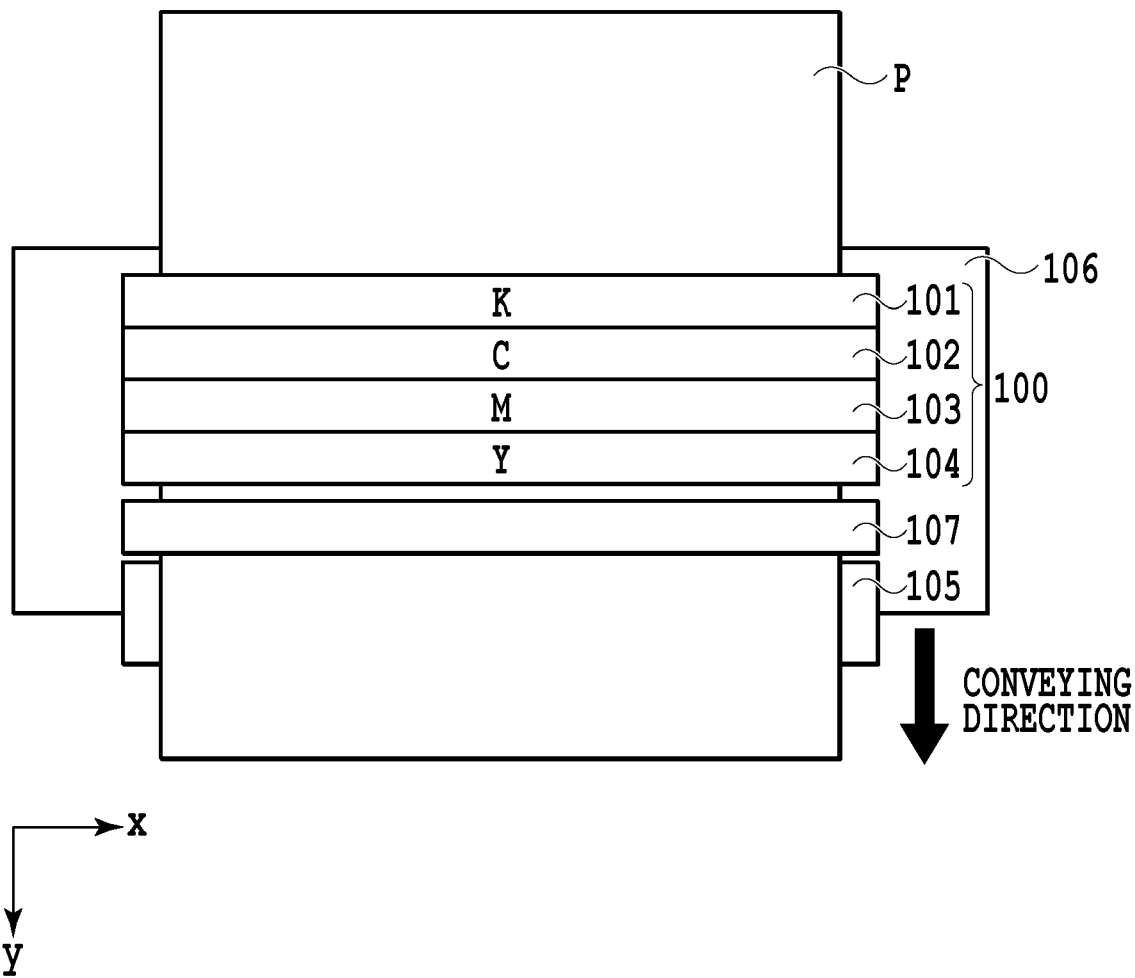
FIG. 5 is a schematic view illustrating the configuration of an inkjet printing apparatus.

FIG. 5 is a schematic view illustrating the configuration of an inkjet printing apparatus that can be used as the complex machine 6 of this embodiment (hereinafter also may be simply referred to as a printing apparatus). The printing apparatus of this embodiment is a full line-type printing apparatus in which the printing head 100 and a reading head 107, which have a width similar to that of a sheet P that may be a printing medium or an inspection target, are parallelly arranged in a Y direction. The printing head 100 includes four printing element columns 101 to 104 through which inks of black (K), cyan (c), magenta (M), and yellow (Y) are ejected, respectively. These printing element columns 101 to 104 are parallelly arranged in a conveying direction of the sheet P (Y direction). At a position further downstream of the printing element columns 101 to 104, the reading head 107 is provided. The reading head 107 includes therein a plurality of reading elements for reading a printed image arranged in the X direction.

In order to perform printing processing or reading processing, the sheet P is conveyed at a predetermined speed in accordance with the rotation of a conveying roller 105 in the Y direction of the drawing. During this conveyance, the printing processing by the printing head 100 or the reading processing by the reading head 107 is performed. The sheet P at a position at which the printing processing by the printing head 100 or the reading processing by the reading head 107 is performed is supported from the lower side by a platen 106 consisting of a flat plate to thereby maintain the distance from the printing head 100 or the reading head 107 or the smoothness.

Figure 6A:
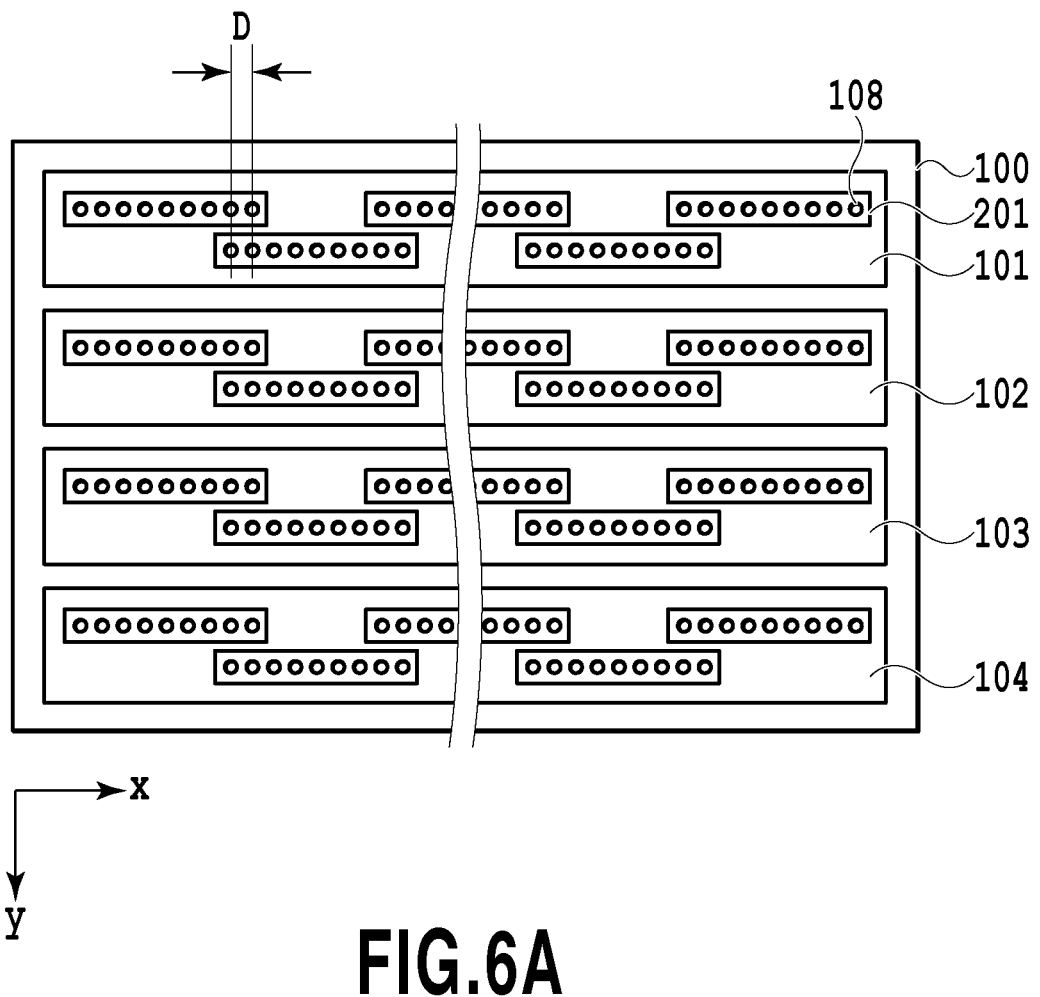
FIGS. 6A and 6B illustrate the arrangement configuration of a printing element of a printing head and a reading element of reading head.
Figure 6B:
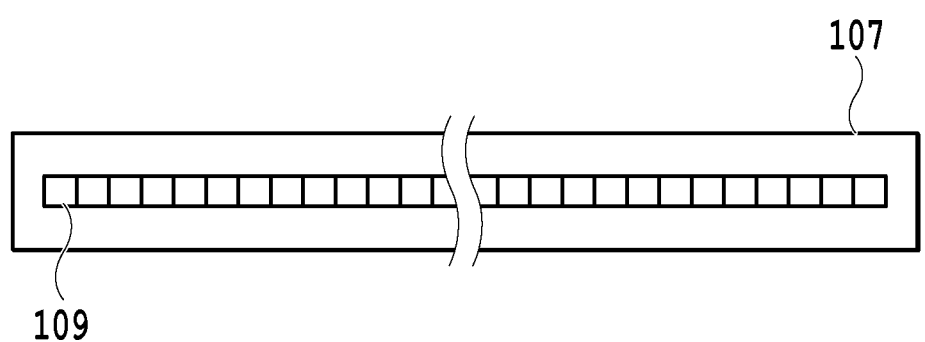

FIGS. 6A and 6B illustrate the arrangement configuration of printing elements in the printing head 100 and the arrangement configuration of reading elements in the reading head 107. In the printing head 100, the printing element columns 101 to 104 corresponding to the respective ink colors are configured so that a plurality of printing element substrates 201 in which a plurality of printing elements 108 are arranged at a fixed pitch are alternately arranged in the Y direction so as to be continuous in the X direction while having the overlap region D. To the sheet P conveyed at a fixed speed in the Y direction, ink is ejected through the individual printing elements 108 based on the printing data at a fixed frequency, thereby printing an image having the resolution corresponding to the arrangement pitch of the printing element 108 onto the sheet P. On the other hand, the reading head 107 includes therein a plurality of the reading sensors 109 arranged in the X direction with a predetermined pitch.

Figure 7:
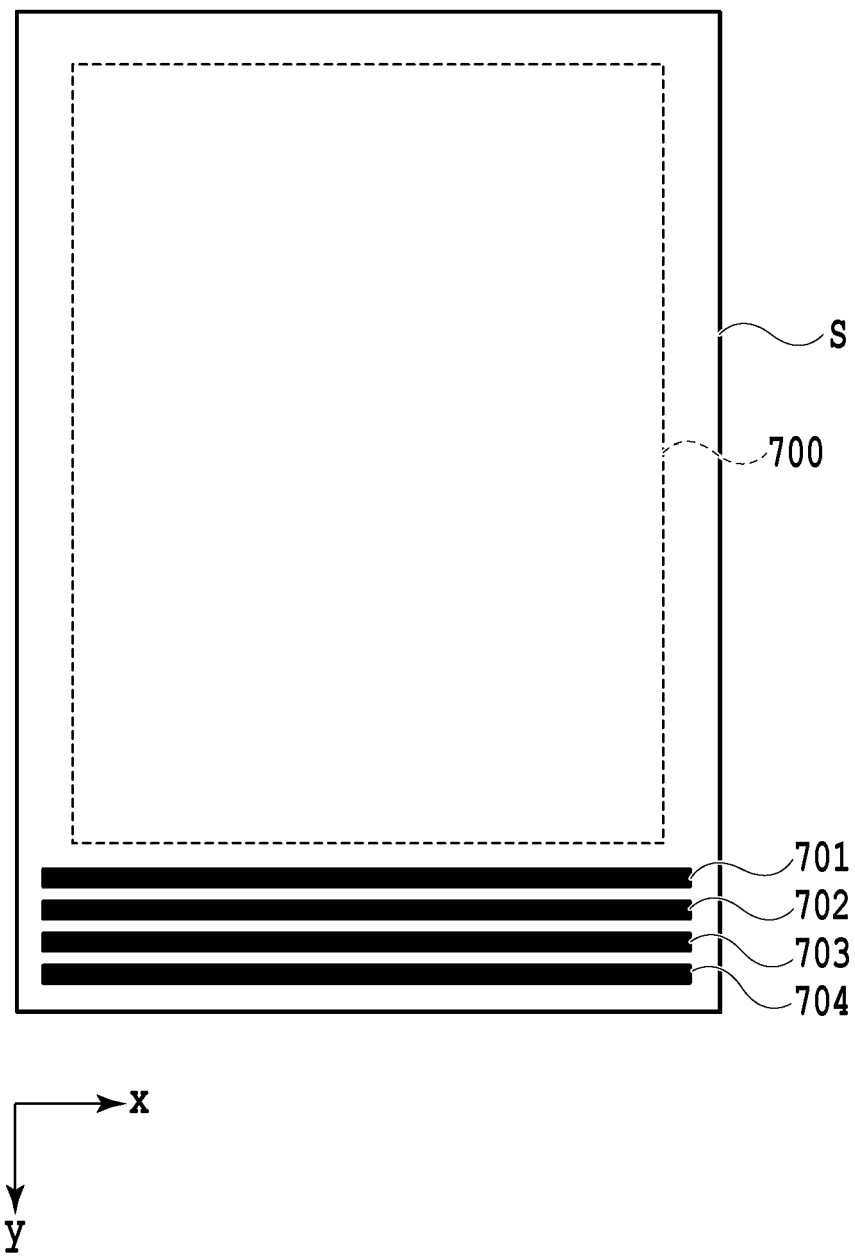
FIG. 7 illustrates the layout of an image printed on a sheet and an inspection pattern.

FIG. 7 illustrates the layout of an image 700 printed on a sheet P and inspection patterns 701 to 704. The inspection patterns 701 to 704 are printed by each of the printing element column 101 to 104 by corresponding inks. If any of the printing element columns 101 to 104 includes a no-ejection printing element, then a white stripe extending in the Y direction appears at the corresponding position of the corresponding pattern. The inspection patterns 701 to 704 are printed on a margin of a tip end of the sheet for each page (i.e., for each sheet) so as to be printed prior to the image 700 and are read by the reading head 107. The reading head 107 images the inspection patterns 701 to 704 conveyed in the Y direction at a fixed speed using the reading element of the individual reading sensor 109 at a predetermined frequency.

Figure 8:
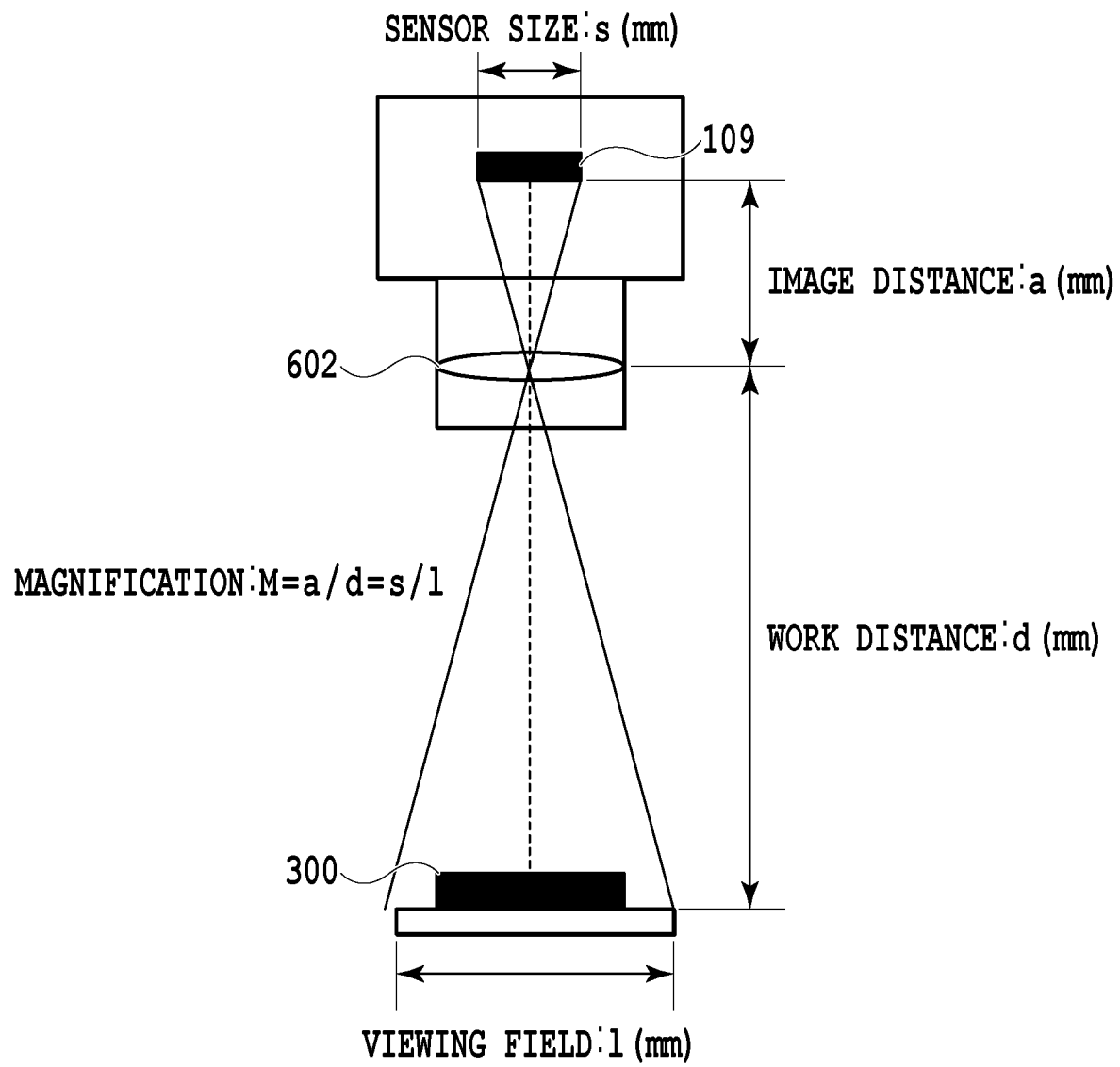
FIG. 8 illustrates how a target object is read by one of reading sensors.

FIG. 8 illustrates how a target object is read by one of the reading sensors 109. Light emitted from a not-shown light source is reflected by the surface of an inspection target object 300 and is collected by a lens 602 and is subsequently detected by the plurality of respective reading elements arranged in the reading sensor 109. In this embodiment, an individual reading element is configured to include three reading elements for outputting the respective brightness signals of R (red), G (green), and B (blue) in a region functioning as a minimum unit of a reading pixel. The image data read by the reading head 107 is RGB brightness data having the resolution corresponding to a pitch at which the reading elements are arranged and is sent to the CPU 311.

By the configuration as described above, when it is determined that an ejection failure exists based on the reading result of the inspection patterns 701 to 704 by the reading head 107, then the printing head 100 can be subjected to a recovery processing prior to the execution of the printing of the image by the printing head 100. However, the invention is not limited to this embodiment. The inspection patterns 701 to 704 may be printed not for one page but for a predetermined page number or also may be printed at each predetermined time or also may be appropriately printed based on a user command. It is not required to print the inspection patterns on the same page of an actual image. Thus, only the inspection patterns may be printed on one page. Furthermore, after a sheet on which the inspection patterns are printed is discharged, the sheet may be fed again for a reading processing.

The following section will specifically describe the singular portion detection algorithm in this embodiment. The singular portion detection algorithm of this embodiment is an algorithm to image the inspection patterns 701 to 704 shown in FIG. 7 by the reading head 107 to use a stochastic resonance processing to accurately detect, in the resultant image data, a singular portion caused by an ejection failure of the printing head 100. This embodiment is not limited to an inkjet printing apparatus as the complex machine 6. The following section will illustratively assume a case where an image printed by the printing head 100 of the complex machine 6 is read by the reading head 107 of the same complex machine and the resultant image data is image-processed by the image processing apparatus 1 connected to the complex machine 6 to thereby detect a singular portion.

Figure 9:
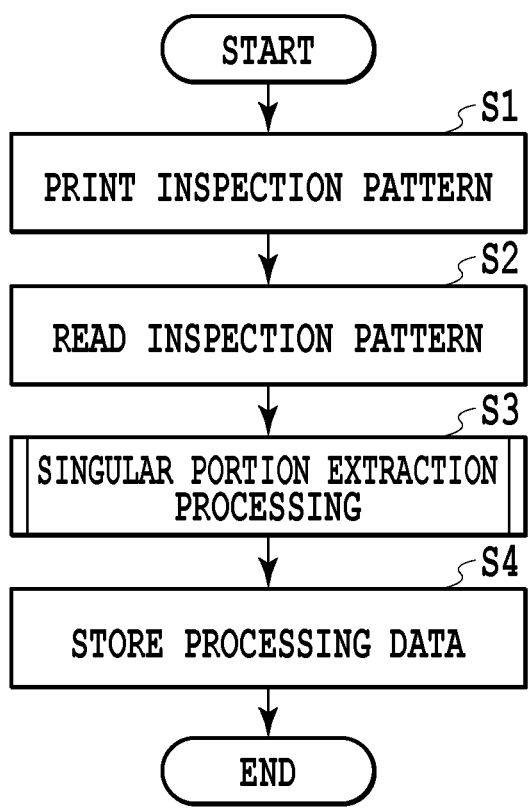
FIG. 9 is a flowchart to explain basic steps of a singular portion detection algorithm.

FIG. 9 is a flowchart illustrating the basic steps of the singular portion detection algorithm executed by the image processing apparatus 1 of this embodiment. When this processing is started, the image processing apparatus 1 in Step S1 allows the printing unit 5 to print the inspection patterns 701 to 704. Specifically, the image processing apparatus 1 accesses the CPU 311 of the complex machine 6 to supply the sheet P into the apparatus. Then, the image processing apparatus 1, via the head controller 314, allows the printing head 100 to print the inspection patterns 701 to 704 as described with reference to FIG. 7 onto a tip end of the sheet P.

Next, in Step S2, the image processing apparatus 1 causes the reading unit 2 to read the inspection patterns 701 to 704 printed in Step S1. Specifically, the image processing apparatus 1 drives the scanner controller 307 to obtain output signals from a plurality of reading elements arranged in the reading sensor 109 and stores these signals in the RAM 312 as multivalued RGB data.

In Step S3, the image processing apparatus 1 executes the singular portion extraction processing and stores the resultant information for the singular portion in the RAM 312 for example in Step S4. The singular portion extraction processing executed in Step S3 will be described in detail later. Then, this processing is completed. In a case where a singular portion corresponding to an ejection failure is extracted, then the image processing apparatus 1 can use this information variously. For example, a maintenance processing for recovering the ejection failure may be carried out immediately after this processing or an image processing may be carried out on the next-inputted image data to allow a white stripe caused by the ejection failure to be less conspicuous.

Prior to the description of a specific step of the singular portion extraction processing of Step S3, the following section will firstly describe the stochastic resonance processing used in this embodiment.

Reference is made again to FIG. 2 illustrating the concept of the processing using the stochastic resonance phenomenon also disclosed in Non-Patent Document 1. An input signal I(x) shows a signal value corresponding to the individual pixel read by a reading sensor 109. x shows the pixel position. The input signal I(x) is branched to M pieces and parallelly subjected to in the following way. The input signal I(x) is the respective pieces are added with different noises $N(x,m) \times K$. Here, m is a parameter showing one of M branch paths and is an integer in the range from 1 to M. N(x,m) shows a random number corresponding to the branch path m of the pixel position x and has a value in the range from 0 to 1. The value $N(x,m) \times K$ obtained by multiplying the random number N(x,m) by the noise strength K as an integer is added to the input signal I(x). That is, when assuming that the signal value after the addition of noise is i(x,m), then the following formula can be obtained.

$$i(x,m) = I(x) + N(x,m) \times K \quad \text{(Formula 1)}$$

By comparing the signal value i(x,m) after the noise addition with a predetermined threshold value T, a nonlinear processing (binary processing) is performed to thereby obtain a binary signal j(x,m). Specifically, the following is established.

$$i(x,m) \geq T \rightarrow j(x,m) = 1$$

$$i(x,m) < T \rightarrow j(x,m) = 0 \quad \text{(Formula 2)}$$

Thereafter, M binary signals j(x,m) are synthesized and subjected to average processing. The resultant value is set as the signal value J after the stochastic resonance. That is, the following is established.

$$J(x) = \frac{1}{M} \sum_{m=1}^{M} j(x, m) \quad \text{(Formula 3)}$$

Figure 1:
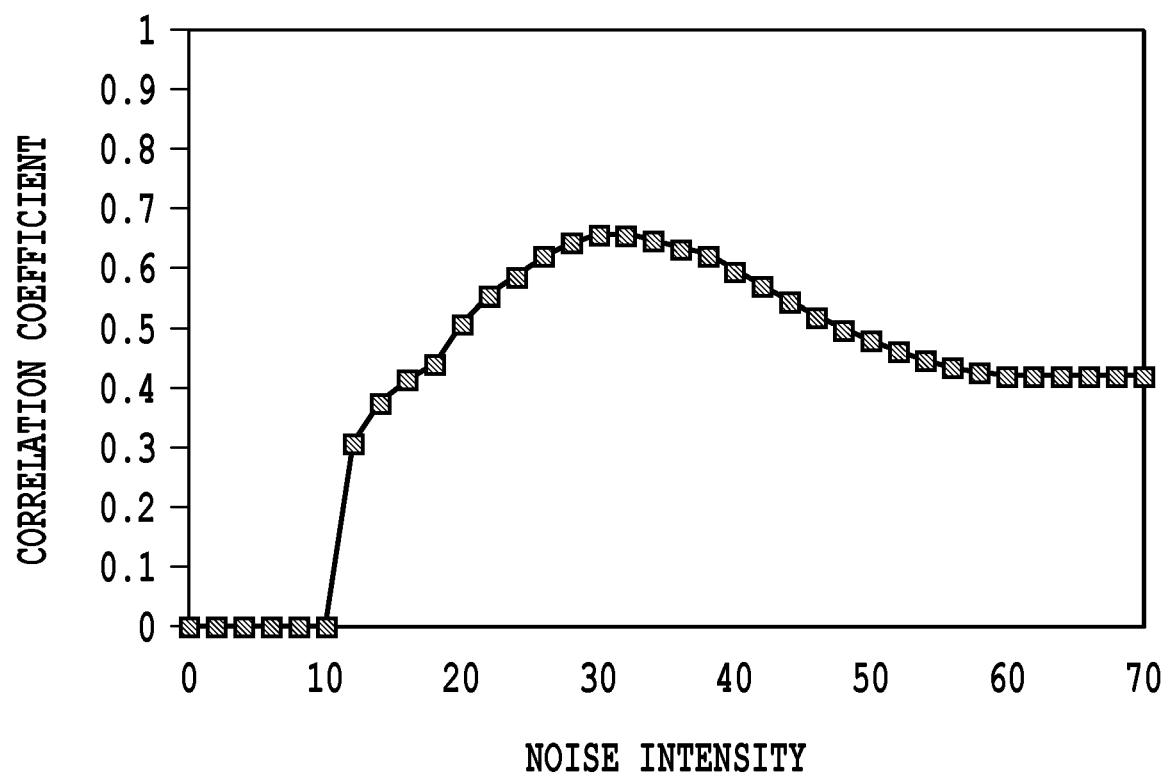
FIG. 1 illustrates the relation between a noise strength and a correlation coefficient in a stochastic resonance processing.
Figure 2:
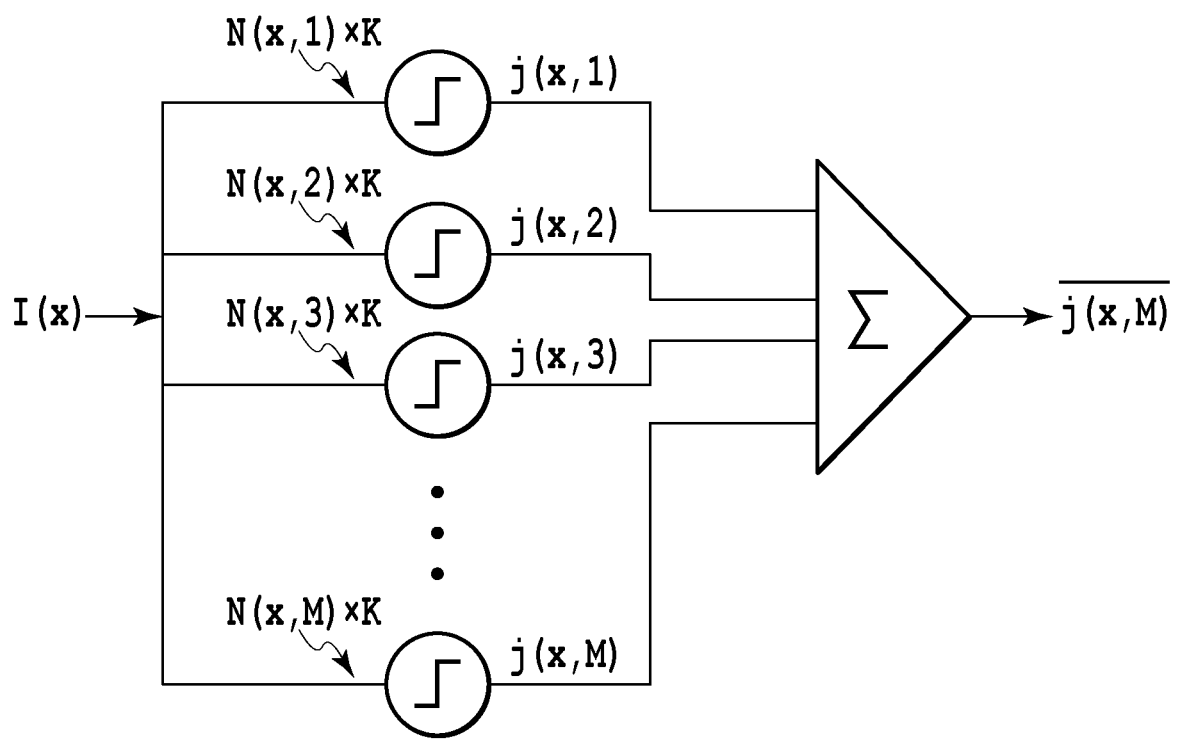
FIG. 2 illustrates the stochastic resonance processing in Non-Patent Document 1.

According to Non-Patent Document 1, it is described that an increase of the value M increases the robustness against the noise strength K. An increase of the value M allows the signal value J(x) to be closer to a value showing the probability at which the input signal value I(x) of each pixel exceeds the binary threshold value T in the nonlinear processing. In other words, deriving a formula for calculating the probability at which the input signal value I(x) exceeds the binary threshold value T allows, without requiring many noise addition processing operations or nonlinear processing operations as shown in FIG. 2, detection processing equivalent thereto. Thus, the following section will describe the probability at which the input signal value I(x) exceeds the binary threshold value T.

Figure 10A:
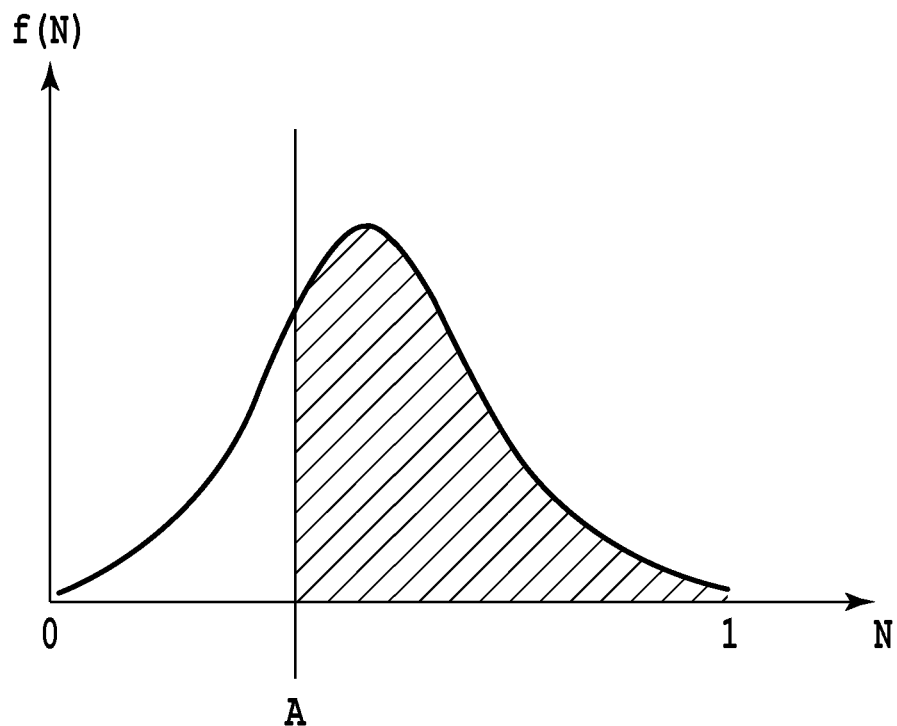
FIGS. 10A and 10B illustrate a histogram when a random number is generated.
Figure 10B:
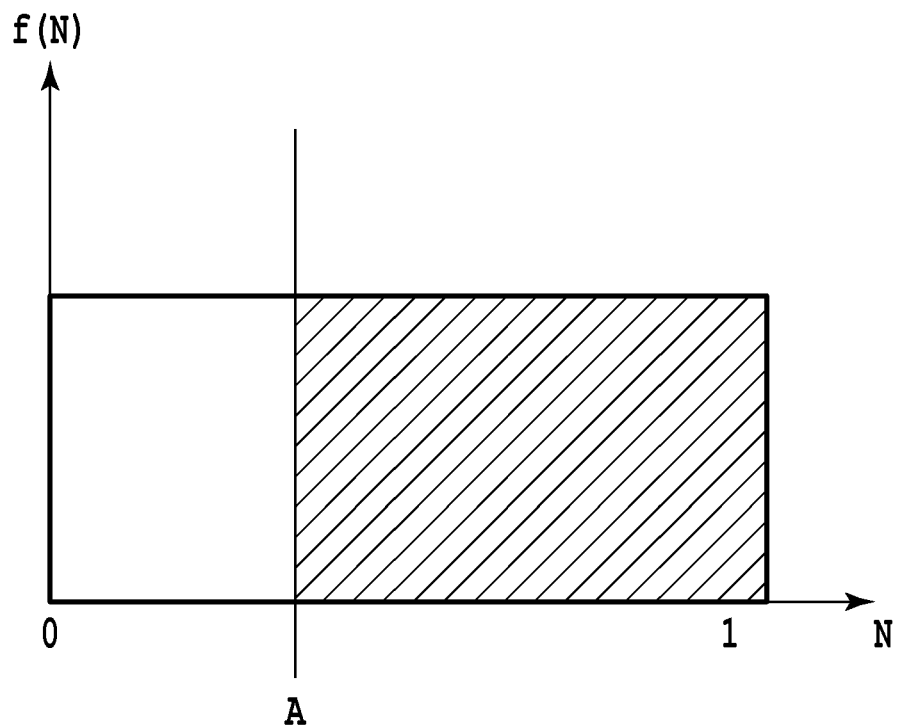

FIGS. 10A and 10B illustrate a histogram that is convergent in a case where infinitely many random numbers N are generated. The horizontal axis shows the random number N in the range from 0 to 1. The vertical axis shows the probability f(N) generated by each value N. FIG. 10A illustrates a case where the average value is 0.5 and the normal distribution based on $3\sigma=1$ is used. FIG. 10B illustrates a case where the random number N in the range of 0 to 1 is generated at the same frequency (so-called white noise). The following description will be made based on the assumption that the random number N is generated based on such a distribution.

According to the formula 1 and formula 2, the probability at which the result after the binarization of the individual pixel is j(x,m)=1 is equal to the probability at which:

$$I(x)+N(x,m)\times K \geq T \text{ is established.}$$ (5)

Assuming that K(strength) has a positive value, then the above formula can be expressed as:

$$N(x,m) \geq \{T-I(x)\}/K \quad \text{(Formula 4)}$$

Assuming that the right side is A, then the following formula can be established.

$$N(x,m) \geq A \quad \text{(Formula 5)}$$

The probability at which the result of the individual pixel after the binarization j(x,m) is j(x,m)=1 (i.e., the signal value J(x) after the stochastic resonance processing) is a probability that the formula 5 is satisfied. In the respective diagrams of FIGS. 10A and 10B, the areas of the shaded areas correspond to this probability and can be represented by the following formula.

$$J(x) = \begin{cases} 1 & A < 0 \\ 0 & A > 1 \\ 1 - \int_{N=0}^{A} f(N)dN & 0 \leq A \leq 1 \end{cases} \quad \text{(Formula 6)}$$

In the case where the histogram for the generation of the random number N has a normal distribution as shown in FIG. 10A, then the formula 6 is represented as shown below.

$$J(x) = \begin{cases} 1 & A < 0 \\ 0 & A > 1 \\ 1 - \dfrac{1}{1+\exp\{-\alpha(A-0.5)\}} & 0 \leq A \leq 1 \end{cases}$$

In a case where the histogram for the noise N has the normal distribution of $\pm 3\sigma=1$, then the coefficient $\alpha$ is about $\alpha=10.8$. In a case where the constant A is returned to the original formula $\{T-I(x,m)\}/K$, then the formula 7 is represented as shown below.

$$J(x) = \begin{cases} 1 & T < I(x) \\ 0 & I(x) < T-K \\ 1 - \dfrac{1}{1+\exp\left\{-\alpha\left(\dfrac{(T-I(x))}{K}-0.5\right)\right\}} & T-K \leq I(x) \leq T \end{cases} \quad \text{(Formula 7)}$$

In a case where the histogram for the generation of the random number N is as shown in FIG. 10B on the other hand, then the formula 6 can be represented as shown below.

$$J(x) = \begin{cases} 1 & A < 0 \\ 0 & A > 1 \\ 1 - A & 0 \leq A \leq 1 \end{cases}$$

When the constant A is returned to the original formula $\{T-I(x)\}/K$, the formula 8 is represented as shown below.

$$J(x) = \begin{cases} 1 & T < I(x) \\ 0 & I(x) < T-K \\ 1-(T-I(x))/K & T-K \leq I(x) \leq T \end{cases} \quad \text{(Formula 8)}$$

Figure 11A:
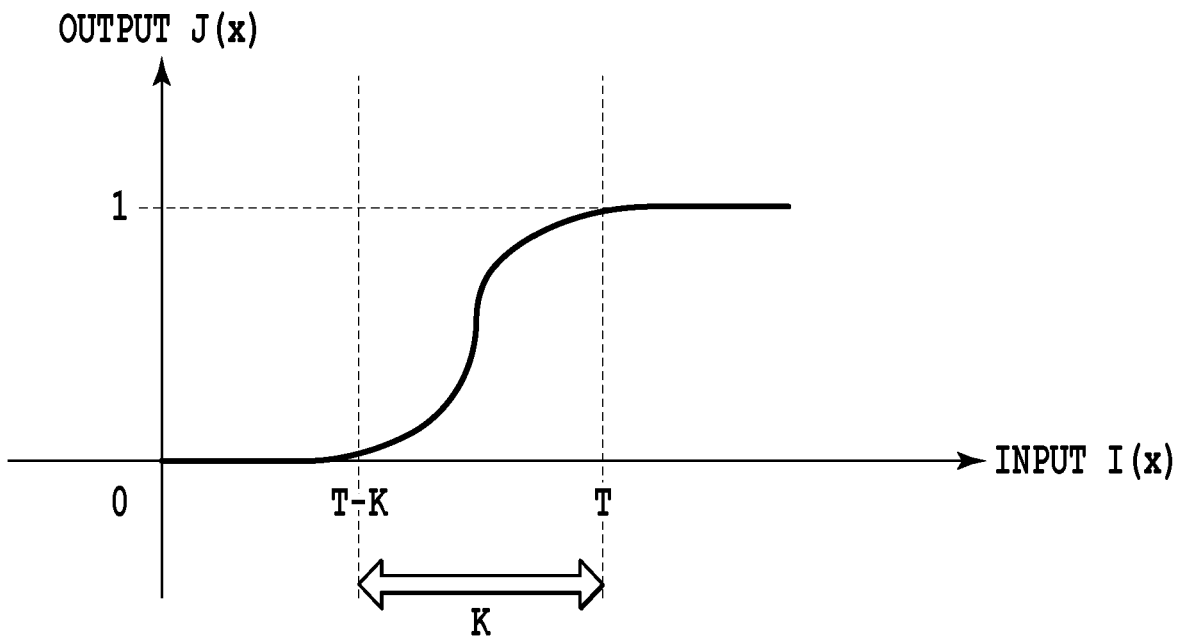
FIGS. 11A and 11B illustrate a graph shown by the formula 7 and formula 8.
Figure 11B:
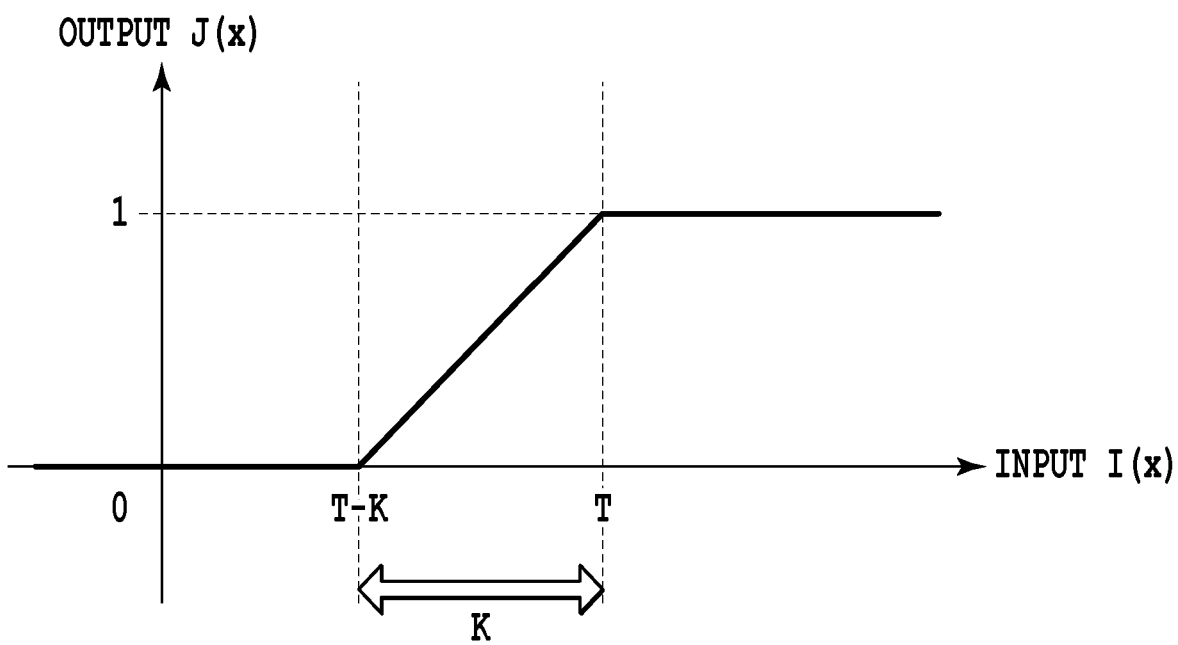

FIGS. 11A and 11B illustrate the formula 7 and the formula 8 by graphs. By using the formula 7 or formula 8 under appropriate noise strength K and appropriate threshold value T, a singular portion can be extracted at such an accuracy that is the same as an accuracy at which the method of Non-Patent Document 1 is used to set a branch number M to the input signal value I(x) at infinity. That is, a result corresponding to a case where parallel processing for equivalent to infinity are performed can be obtained.

On the other hand, since there is no need to prepare many circuits as in Non-Patent Document 1, a relatively simple and high-speed processing can be carried out. As described above, the stochastic resonance processing used in this embodiment has been described.

Figure 12:
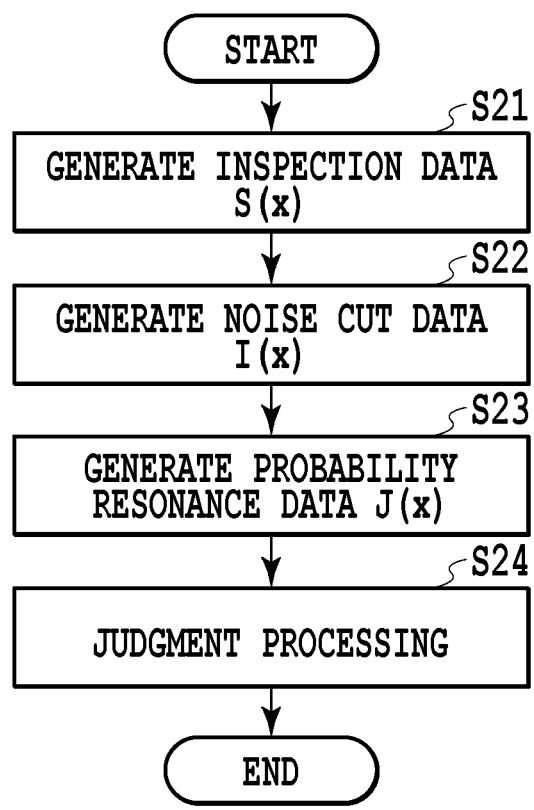
FIG. 12 is a flowchart illustrating a singular portion extraction processing step in the first embodiment.

FIG. 12 is a flowchart for explaining specific steps carried out by the image processing apparatus 1 of this embodiment in the singular portion extraction processing of Step S3. When this processing is started, the image processing apparatus 1 firstly generates, in Step S21, inspection data S(x) based on multivalued RGB data stored in the RAM 312 in Step S2 of FIG. 9.

For example, in order to perform an ejection failure detection for a printing element column 102 ejecting cyan ink, then R(red) data that is complementary to cyan is read and R signal values are arranged to correspond to a plurality of printing elements arranged in the X direction. Then, an addition processing is performed in the Y direction and the result is stored as S(x). The variable x shows a position at which a printing element is arranged in the X direction and may have a value in the range from 1 to 128 in this embodiment. In the case of magenta ink and yellow ink, a G (green) signal value and a B (blue) signal value complementary to magenta and yellow, respectively, may be used and may be subjected to the same processing as the above one. In the case of black ink, any of R, G, and B signal values may be used or a value obtained by subjecting them to a weighted-average processing with a predetermined ratio may be used.

Figure 13A:
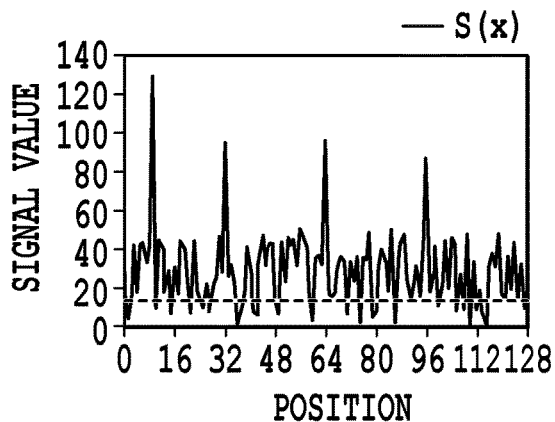
FIGS. 13A to 13F illustrate the inspection signal S(x) and the result after the processing.

FIGS. 13A to 13F illustrate the inspection data S(x) generated in Step S21 and the result of subjecting this to various processing. FIG. 13A illustrates the inspection data S(x) generated in Step S21 in which the horizontal axis shows the arrangement position x of printing elements. FIG. 13A illustrates, as an example, a result where a printing head is used in which, among 128 printing elements, four printing elements corresponding to x=9, 32, 46, 96 correspond to ejection failure to print a detection pattern to thereby read the result by the reading head 107. When the inspection data is generated in Step S21, since the addition processing in Y direction is carried out, the position (x) at which a white stripe extending in the Y direction has the inspection data S(x) highly emphasized than other positions. As shown in FIG. 13A, it can be seen that the position of x=9, 32, 46, 96 corresponding to the no-ejection printing elements shows, although including a certain amount of noise, the generation of a brightness value peak therein. The singular portion extraction processing of this embodiment has an objective of extracting such a peak as a specific signal in an accurate and high-speed manner.

Returning to FIG. 12, Step S22 subjects the inspection data S(x) generated in Step S21 to noise cut processing.

Figure 13B:
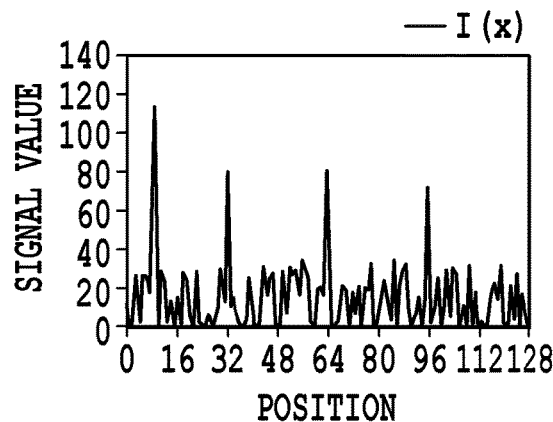

Specifically, a predetermined noise value Z is uniformly deducted from the inspection data S(x) to obtain noise cut data I(x)=S(x)−Z. The noise value Z shows an approximate noise strength included in a signal value read by the reading head 107 and is a fixed value set to an appropriate value in advance depending on the printing apparatus, the ink type, or the sheet type for example. For example, an image printed by the printing head 100 for which ejection failure does not exist therein can be read by the reading head 107. Then, the noise value Z can be set based on the noise amplitude of the resultant image data. In FIG. 13A, the noise value Z=14 is shown as the broken line with the inspection signal S(x). In FIG. 13B, the noise cut data I(x) obtained in Step S22 is shown. This noise cut data I(x) is the input signal I(x) of the stochastic resonance processing in this embodiment.

Figure 13C:
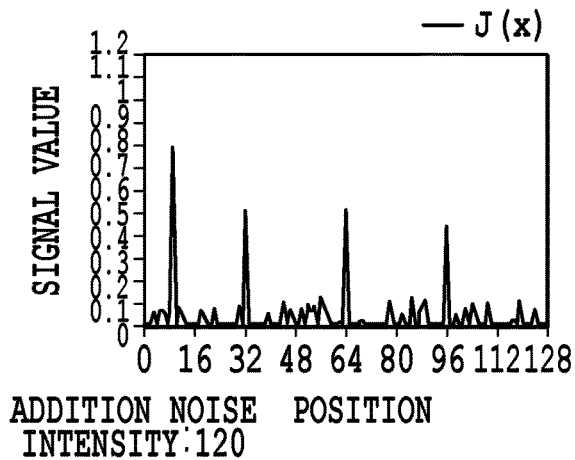

Returning to FIG. 12, Step S23 subjects the noise cut data I(x) obtained in Step S22 to the above-described stochastic resonance processing. Specifically, the formula 7 or formula 8 is used to obtain the stochastic resonance data J(x). FIG. 13C shows the stochastic resonance data J(x) obtained in Step S23. Here, a case is shown in which the noise strength used for the stochastic resonance processing is K=120 and the threshold value is T=140.

Figure 13D:
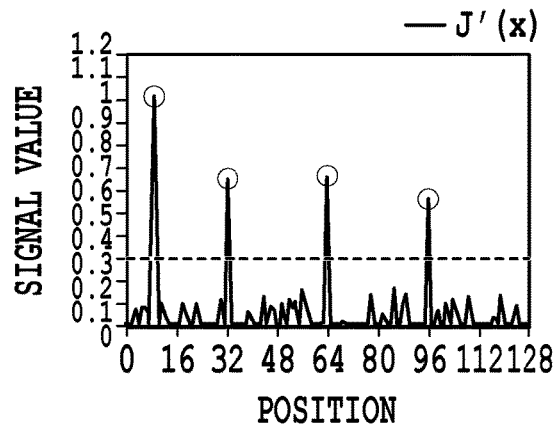

Then, in Step S24, the stochastic resonance data J(x) obtained in Step S23 is used to execute judgment processing. Specifically, the stochastic resonance data J(x) is normalized in a range from 0 to 1 to set the result as J'(x). Thereafter, the normalization data J'(x) is compared with the judgment threshold value D prepared in advance to extract J'(x) exceeding the judgment threshold value D. In FIG. 13D, the judgment threshold value D is set to D=0.3 and is shown in the same graph of J'(x). As a result of the judgment as described above, as shown by the circle of FIG. 13D, it is judged that J'(9), J'(32), J'(46), and J'(96) exceed the judgment threshold value D and x=9, 32, 46, 96 is extracted as a singular portion. During this, the display apparatus connected via the display I/F 306 may display a pixel having a value equal to or higher than the judgment threshold value D so that the value can be observed by the inspector or also may directly display J'(x). Then, this processing is completed. Thereafter, in Step S4 of FIG. 9, x=9, 32, 46, 96 is stored in the RAM 302(312), for example, to correspond to the printing element column.

Figure 14:
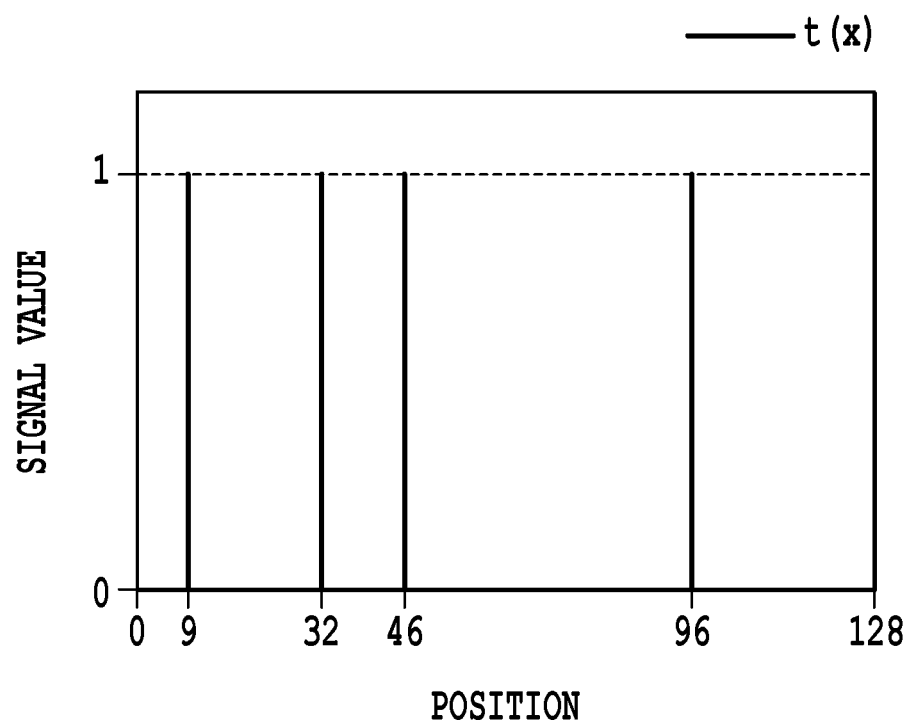
FIG. 14 illustrates detection target data not including noise.

The following section will describe the effect of the singular portion extraction processing of this embodiment. FIG. 14 shows data showing that the printing elements x=9, 32, 46, 96 correspond to ejection failure in a case where no noise is included at all. This will be called as detection target data t(x) hereinafter. In the present invention, the singular portion extraction processing has an objective of deriving such a result that is maximally similar to this detection target data t(x) based on the inspection data S(x).

Here, a correlation coefficient C is defined that shows the correlation (similarity) to the detection target data t(x). The correlation coefficient C is a detection performance evaluation value showing the correlation level between the detection target data t(x) shown in FIG. 14 and the normalization data J'(x) after the stochastic resonance processing shown in FIG. 13D. The correlation coefficient C can be represented by the following formula 9.

$$C = \frac{\sum_{x=1}^{L}(t(x)-\bar{t})(J'(x)-\bar{J'})}{\sqrt{\sum_{x=1}^{L}(t(x)-\bar{t})^2}\sqrt{\sum_{i=1}^{L}(J'(x)-\bar{J'})^2}} \quad \text{(Formula 9)}$$

In the formula, L denotes the pixel number and L=128 is established in this example. t(x) shows a detection target signal shown in FIG. 14 and J'(x) shows a signal obtained by performing the above stochastic resonance processing and normalization processing. The reference numeral $\bar{t}$ shows an arithmetic mean value of t(x). $\bar{J'}$ represents the arithmetic mean value of J'(x). The correlation coefficient C shows an evaluation value that is closer to 1 when two signal groups as a comparison target have a higher correlation and that is closer to 0 when the correlation is lower. That is, the correlation coefficient C closer to 1 shows that the normalization data J'(x) after the stochastic resonance processing is closer to the detection target signal t(x). After the stochastic resonance processing is carried out, the correlation coefficient C of the normalization data J'(x) shown in FIG. 14 to the detection target signal t(x) shown in FIG. 14 was C=0.9187.

Figure 13E:
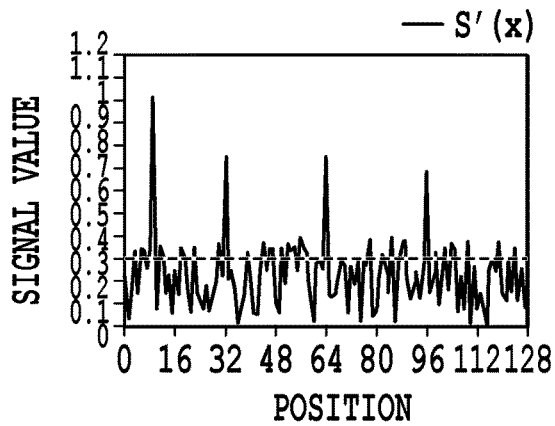

On the other hand, FIG. 13E illustrates the result S'(x) obtained by directly normalizing the inspection data S(x) shown in FIG. 13A. It can be seen that there are positions exceeding the judgment threshold value D, other than x=9, 32, 46, 96. That is, if the result S'(x) obtained by directly normalizing the inspection data S(x) is subjected to the judgment processing, there is a higher possibility where a position at which ejection failure does not occur is unintendedly extracted as an ejection failure. The correlation coefficient C of S'(x) to the detection target data t(x) as described above can be calculated by exchanging J'(x) in the formula 9 with S'(x). In the case of the above, C=0.6756 was established. That is, the correlation coefficient C can be closer to 1 by subjecting the inspection data S(x) to the singular portion extraction processing of this embodiment than in the case where the inspection data S(x) is not subjected to the singular portion extraction processing of this embodiment.

Next, the following section will describe the effect of the noise cut processing performed in Step S22 that is a characteristic of the present invention. The above description has been made based on an assumption that the noise strength K used to perform the singular portion extraction processing is K=120. However, the correlation coefficient C changes depending on also the noise strength K as described above.

Figure 13F:
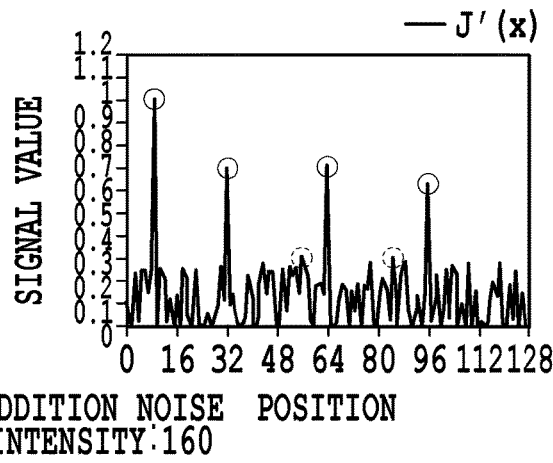

FIG. 13F shows the result obtained by subjecting the inspection data S(x) shown in FIG. 13A to the singular portion extraction processing with the noise strength set to K=160. As in the case where the noise strength shown in FIG. 13D is K=120, J'(x) peaks at the positions of J'(9), J'(32), J'(46), and J'(96). However, the influence by the entire noise causes even regions other than the above ones to have some portions for which J'(x) exceeds the judgment threshold value D=0.3. In the drawing, such a position is shown by the circle shown by the broken line. Thus, in Step S24 of FIG. 12, a position other than that of an actual white stripe is extracted as a singular portion. In Step S4 of FIG. 9, such a position (x) of a printing element is also stored in the RAM 302 (312) for example. The correlation coefficient C to the detection target data t(x) of the normalization data J'(x) shown in FIG. 13F is calculated based on the formula 9, resulting the value of C=0.7375. That is, when the inspection data S(x) is as shown in FIG. 13A, a noise strength of K=120 is more preferred than K=160.

FIG. 15 illustrates the correlation coefficients C in a case where the singular portion extraction processing of this embodiment is not performed with respect to the processing target signal S(x), in a case where the singular portion extraction processing is performed under the noise strength K=120, and in a case where the singular portion extraction processing is performed under the noise strength K=160. In a case where the processing target signal S(x) is as shown in FIG. 13A, then such a configuration is considered to be optimal to subject the processing target signal S(x) to the singular portion extraction processing under the noise strength K=120 because this configuration allows the correlation coefficient C to be maximally closer to 1.

It is ideal that the noise strength K as described above is appropriately set depending on the assumed strength of a to-be-extracted detection signal, i.e., the assumed strength obtained in a case where the reading sensor reads a white stripe corresponding to an ejection failure portion. However, in the case of the inkjet printing apparatus as used in this embodiment, if a constant signal for ejecting is applied to the printing head 100, the ejection amount from an individual printing element changes depending on the environment temperature, the environment humidity, or the usage conditions of the printing head for example. Thus, the size of a white stripe formed on the sheet P, the reading result, or the buried status in noise changes depending on the environment or usage conditions. That is, the optimal noise strength K changes depending on the use environment or situation. In other words, no matter what kind of a noise strength K is prepared in advance, the noise strength does not always have an optimal value depending on the environment or situation.

Referring to FIG. 15 again, even if the noise strength K=160 is used, the correlation coefficient C=0.7375 is higher than the correlation coefficient C=0.6756 obtained in a case where the singular portion extraction processing is performed, thus showing the effect by the execution of the singular portion extraction processing. The noise cut processing performed in Step S22 as a characteristic of the present invention contributes to such an effect. That is, the noise cut processing as in Step S22 allows, even when the noise strength K set in advance is slightly dislocated from the optimal noise strength changing depending on the environment or situation at the time, the correlation coefficient C to be maintained at some high value. This will be described in detail.

Figure 16A:
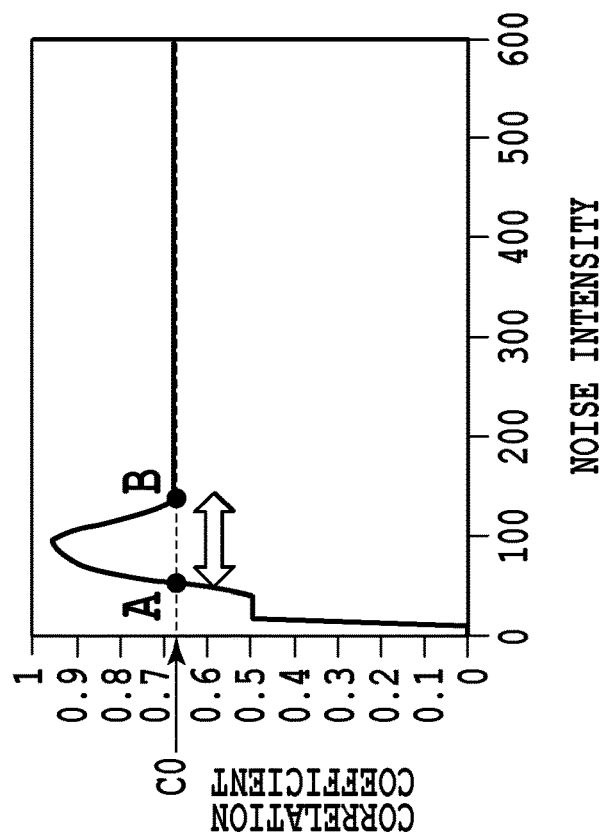
FIGS. 16A and 16B illustrate the relation between a noise strength K and a correlation coefficient C.
Figure 16B:
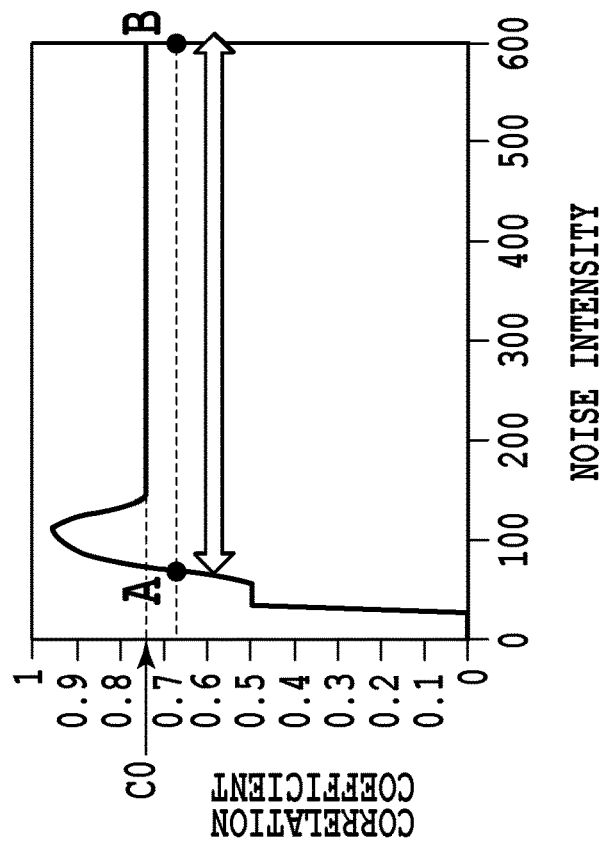

FIGS. 16A and 16B illustrate the correlation coefficient C(K) obtained in a case where the noise strength K is changed in the range from 0 to 600 while fixing the stochastic resonance threshold value to T=140. The horizontal axis shows the noise strength K and the vertical axis shows the correlation coefficient C. FIG. 16A illustrates the case where the noise cut processing of Step S22 is performed and FIG. 16B illustrates the case where the noise cut processing of Step S22 is omitted, respectively. In FIGS. 16A and 16B, the broken line shows the correlation coefficient C=0.6756 when the singular portion extraction processing is not performed.

In any of the drawings, when the noise strength K is gradually increased from 0, then the correlation coefficient C rapidly increases and reaches the local maximum value and then is convergent at the fixed value C0. In FIG. 16B, the fixed value C0 as described above is equal to the correlation coefficient C=0.6756 when the singular portion extraction processing is not performed (C0=0.6756). That is, in a case where the noise cut processing is not performed and the noise strength K is excessively-high, then such a result is merely caused that is similar to a result obtained when the singular portion extraction processing is not performed.

The fixed value C0 of FIG. 16A on the other hand is a value higher than the correlation coefficient C when the singular portion extraction processing is performed (C0>0.6756). That is, the execution of the noise cut processing provides the effect of the singular portion extraction processing even if the noise strength K is higher than an appropriate value. In the drawing, the noise strength K in a range within which the correlation coefficient C satisfies C>0.6756 has the minimum value A and the maximum value B. In this case, a region from A to B functions as a range within which the effect of the singular portion extraction processing is provided. The magnitude D of the region when the noise cut processing is omitted is D=B−A=84. On the other hand, the magnitude D of the region when the noise cut processing is performed is D=B−A=530. Specifically, the execution of the noise cut processing can expand the range of the magnitude D within which the effect of the singular portion extraction processing can be obtained, thus increasing the robustness against the fluctuation of the noise strength K.

As described above, this embodiment can use, without requiring many nonlinear circuits as in Publication 1 of Japanese Patent Laid-Open No. 2012-175371 and Non-Patent Document 1, a relatively-simple processing to extract a detection target signal from an input signal in an accurate, high-speed, and reliable manner.

Second Embodiment

This embodiment also uses a complex machine shown in FIG. 4 to FIG. 6B to extract a white stripe generated in the inspection patterns 701 to 704 shown in FIG. 7 based on the flowchart shown in FIG. 9. However, in this embodiment, the result obtained by performing the noise cut processing is multiplied by the result obtained by performing the stochastic resonance processing without performing the noise cut processing to calculate the product thereof based on which the judgment processing is performed.

Figure 17:
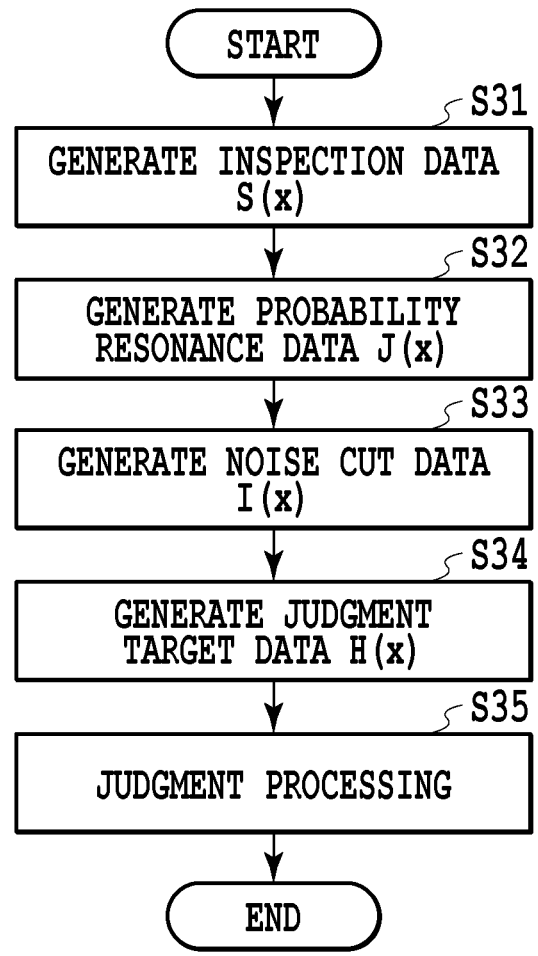
FIG. 17 is a flowchart illustrating the singular portion extraction processing in the second embodiment.

FIG. 17 is a flowchart for explaining specific steps performed by the image processing apparatus 1 of this embodiment in the singular portion extraction processing of Step S3. When this processing is started, then the image processing apparatus 1 firstly generates, in Step S31, the inspection data S(x) based on multivalued RGB data stored in the RAM 312 in Step S2 of FIG. 9. This step is similar to Step S21 of FIG. 12.

Step S32 subjects the inspection data S(x) generated in Step S31 to the stochastic resonance processing. That is, I(x) in the formula 7 or formula 8 is substituted with the inspection data S(x) generated in Step S21 to thereby obtain the stochastic resonance data J(x).

Step S33 subjects the inspection data S(x) generated in Step S31 to the noise cut processing to thereby obtain the noise cut data I(x)=S(x)−Z.

Step S34 multiplies the stochastic resonance data J(x) obtained in Step S32 by the noise cut data I(x) obtained in Step S33 to thereby obtain the judgment target data H(x) (H(x)=J(x)×I(x)).

Then, Step S35 uses the judgment target data H(x) obtained in Step S33 to execute the judgment processing. Specifically, the judgment target data H(x) is normalized in the range from 0 to 1 to obtain the result as H'(x). Thereafter, H'(x) is compared with the judgment threshold value D prepared in advance to extract H'(x) exceeding the judgment threshold value D.

Figure 18A:
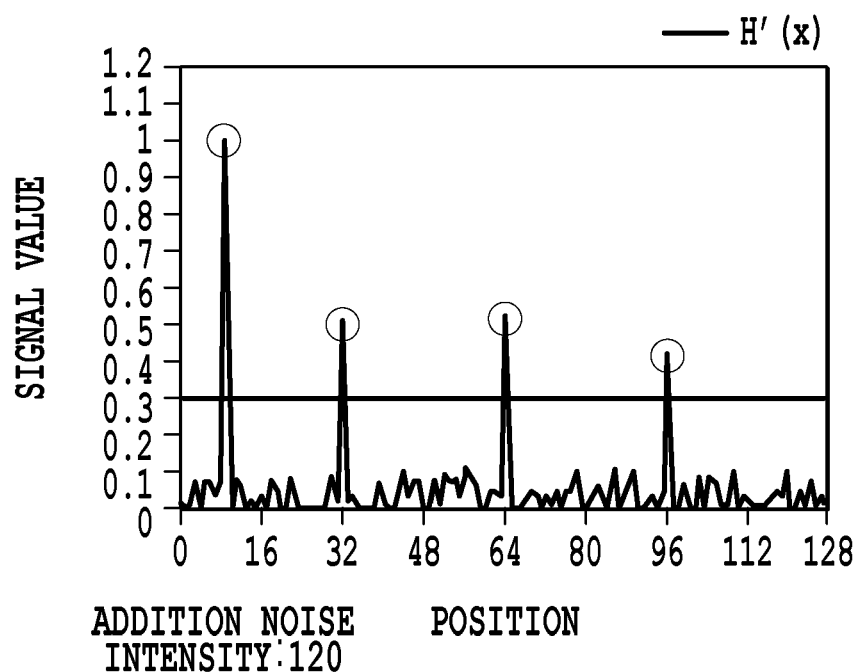
FIGS. 18A and 18B illustrate the judgment processing of the second embodiment.
Figure 18B:
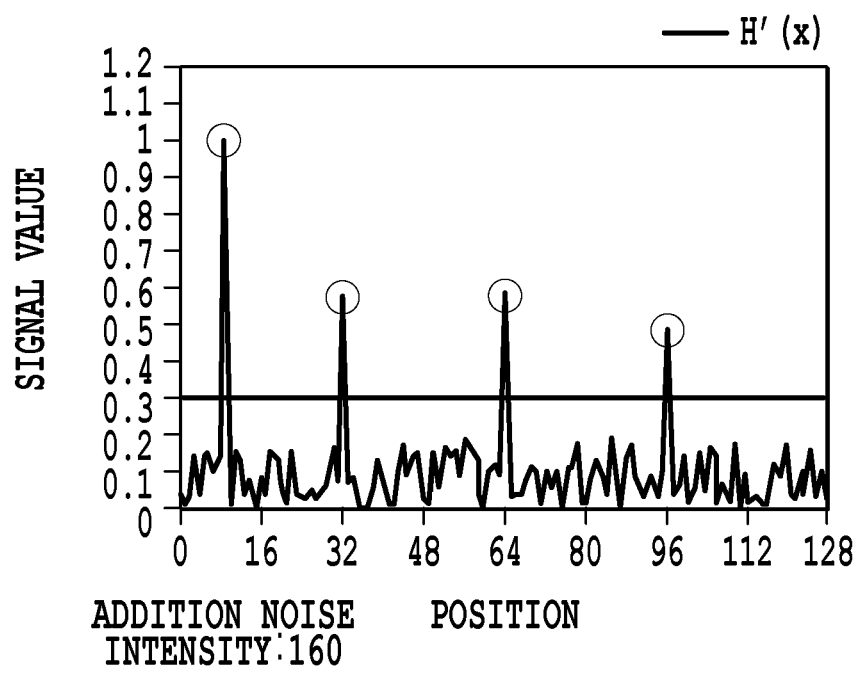

FIGS. 18A and 18B illustrate the judgment processing performed on the judgment target data H(x). FIG. 18A illustrates the case where the noise strength K is set to K=120 while FIG. 18B illustrates the case where the noise strength K is set to K=160, respectively. FIGS. 18A and 18B correspond to FIG. 13D and FIG. 13F described in the first embodiment. Any of FIGS. 18A and 18B is similar to the first embodiment in that J'(x) has peaks at the positions of H'(9), H'(32), H'(46), and H'(96) and the positions of white stripes are effectively extracted.

FIG. 19 shows the correlation coefficients C in a case where the singular portion extraction processing is not performed with respect to the processing target signal S(x), in a case where the singular portion extraction processing of this embodiment is performed under the noise strength K=120, and in a case where the singular portion extraction processing is performed under the noise strength K=160. As in the first embodiment described with reference to FIG. 15, the correlation coefficients C corresponding to any of the noise strengths K are higher than the correlation coefficient C=0.6756 obtained when the singular portion extraction processing is not performed, thus providing the effect obtained by performing the singular portion extraction processing of this embodiment. In the case of this embodiment however, the difference in the correlation coefficient C between the case where the noise strength K is K=120 and the case where the noise strength K is K=160 is lower than that of the first embodiment.

Figure 20:
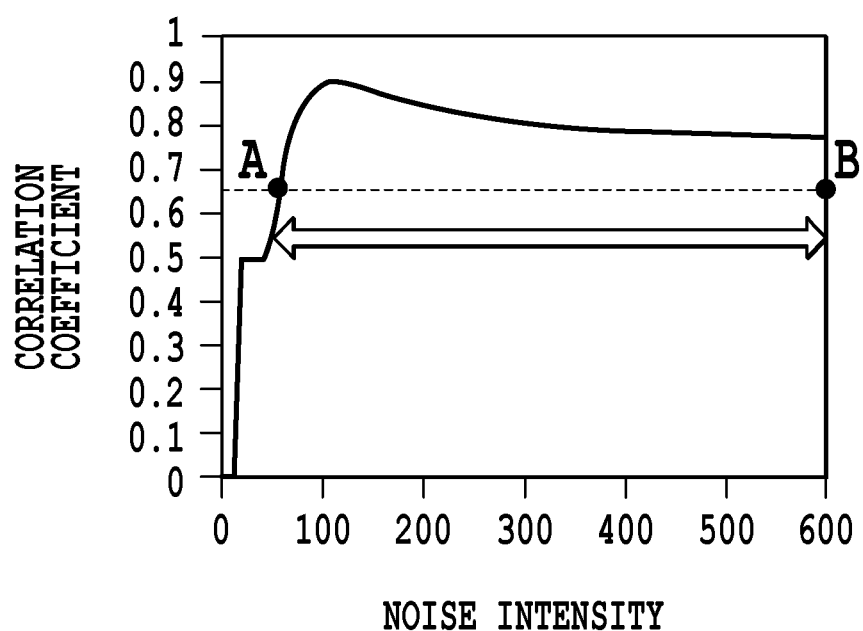
FIG. 20 illustrates the relation between the noise strength K and the correlation coefficient C in the second embodiment.

FIG. 20 illustrates the correlation coefficient C with respect to the noise strength K in this embodiment. This embodiment is similar to the first embodiment in that, when the noise strength K is gradually increased from 0, then the correlation coefficient C rapidly increases and reaches the local maximum value and then is convergent at a fixed value. In the case of this embodiment however, the local maximum value occurs (or the differential value changes) in a manner more slowly than in the case of the first embodiment shown in FIG. 16A. The correlation coefficient C at the local maximum value is lower than the first embodiment but the convergent fixed value C0 is higher than that of the first embodiment. That is, in the case where this embodiment is used, the dispersion of the effects to the fluctuation of the noise strength K can be suppressed than in the case of the first embodiment.

Other Embodiments

As described above, a white stripe caused by an ejection failure has been described as an example. However, the embodiment also can extract an unusual point such as a black stripe caused by defective ejection or another feature such as uneven density. In such a case, the singular portion extraction processing step of Step S2 may be repeatedly executed in order to detect a singular portion having a different feature such as a white stripe or a black stripe while exchanging various parameters. In the case of a black stripe for example, a portion for which the brightness is lower than those of the surrounding portions is extracted as a singular portion. In such a case, the noise strength K may be set a negative value and the portion (x) not exceeding the judgment threshold value D may be extracted as an unusual point.

The configuration of the printing apparatus is not limited to the full line-type printing apparatus as shown in FIG. 5. Thus, a serial-type printing apparatus may be used that prints an image by alternately repeating a printing scanning to perform a printing operation while moving, in the X direction, a printing head composed of a plurality of printing elements arranged in the Y direction and a conveying operation to convey the sheet P in the Y direction crossing the printing scanning. In the case of the serial-type printing apparatus, an ejection failure of the printing head appears as a white stripe extending in the same direction as that of the printing scanning (direction X). Thus, in this case, a series of processing described in FIG. 9 and FIG. 12 may be carried out on the inspection data S(y) obtained through the addition processing in the X direction. In the case of the serial-type printing apparatus, white stripes caused by the ejection failures and a seam line generated between a printing scanning and a printing scanning also can be extracted as a singular portion.

In the above embodiment, an example was described regarding an image processing apparatus for performing a stochastic resonance processing on RGB data for the respective pixels read by the reading head 107. However, the signal extraction processing apparatus of the present invention is not limited to such an embodiment. For example, even in an input signal for which the current value I(x) changes depending on time such as the vibration of an object or a change of sound, a to-be-extracted detection target signal is buried in noise. Even in such a case, the detection target signal can be extracted from the input data I(x) to the time axis x accurately and effectively.

Furthermore, although the above description has been made via an example of a system obtained by connecting the complex machine 6 to the image processing apparatus 1 as shown in FIG. 4 the present invention is not limited to such an embodiment.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-070728 filed Mar. 31, 2016, which is hereby incorporated by reference wherein in its entirety.

What is claimed is:

1. A signal processing apparatus comprising:
    circuitry or at least one processor, configured to act as a plurality of units comprising:
        (1) an acquisition unit configured to acquire input data;

(2) a unit configured to generate noise cut data by deducting uniformly a predetermined fixed value from values of respective signals of the input data;
(3) a stochastic resonance processing unit configured to subject the noise cut data to a predetermined stochastic resonance processing to thereby generate stochastic resonance data; and
(4) an output unit configured to output the result of the predetermined stochastic resonance processing,
wherein the predetermined stochastic resonance processing is processing to output, in a method of adding different noises to the same noise cut data and performing binary processing in a plurality of branch paths respectively, a convergence value obtained in a case where a parallel number is increased,
wherein the predetermined stochastic resonance processing is performed by using the following formula to calculate processed data J(x) from the input data I(x):

$$J(x) = \begin{cases} 1 & T < I(x) \\ 0 & I(x) < T - K \\ 1 - (T - 1(x))/K & T - K \leq I(x) \leq T \end{cases}$$

where T is a threshold value to quantize the input data and K is a noise strength,
or the predetermined stochastic resonance processing is performed by using the following formula to calculate processed data J(x) from the input data I(x):

$$J(x) = \begin{cases} 1 & T < I(x) \\ 0 & I(x) < T - K \\ 1 - \dfrac{1}{1 + \exp\left\{-\alpha\left(\dfrac{(T - I(x))}{K} - 0.5\right)\right\}} & T - K \leq I(x) \leq T \end{cases}$$

where T is a threshold value to quantize the input data and K is a noise strength.

2. The signal processing apparatus according to claim 1, wherein the predetermined value is determined in advance based on the input data in a case where a singular signal is not included therein.

3. The signal processing apparatus according to claim 1, wherein the circuitry or at least one processor is further configured to act as an extraction unit configured to extract a singular signal based on the result of the predetermined stochastic resonance processing.

4. The signal processing apparatus according to claim 3, wherein the extraction unit extracts, as the singular signal, a signal having a value higher than a judgment threshold value determined in advance among the stochastic resonance data.

5. The signal processing apparatus according to claim 1, further comprising:
an image reader configured to read an image,
wherein the input data is acquired by reading of the image reader.

6. The signal processing apparatus according to claim 5, further comprising:
a printer configured to print an image, wherein the image reader reads an image printed by the printer.

7. The signal processing apparatus according to claim 6, wherein the printer prints the image using a printing head configured by arranging a plurality of printing elements for ejecting ink, and wherein the singular signal is a signal corresponding to a stripe-like unevenness in the image caused by ejection failure of a printing element.

8. The signal processing apparatus according to claim 7, wherein based on the result of the predetermined stochastic resonance processing, the printer is subjected to a maintenance processing.

9. The signal processing apparatus according to claim 7, wherein based on the result of the predetermined stochastic resonance processing, image data printed by the printer is subjected to an image processing.

10. The signal processing apparatus according to claim 1, wherein the different noises added to the same noise cut data is white noise, and
wherein the predetermined stochastic resonance processing is performed by using the following formula to calculate processed data J(x) from the input data I(x):

$$J(x) = \begin{cases} 1 & T < I(x) \\ 0 & I(x) < T - K \\ 1 - (T - 1(x))/K & T - K \leq I(x) \leq T \end{cases}.$$

11. The signal processing apparatus according to claim 1, wherein the different noises added to the same noise cut data is normal distribution noise, and
wherein the predetermined stochastic resonance processing is performed by using the following formula to calculate processed data J(x) from the input data I(x):

$$J(x) = \begin{cases} 1 & T < I(x) \\ 0 & I(x) < T - K \\ 1 - \dfrac{1}{1 + \exp\left\{-\alpha\left(\dfrac{(T - I(x))}{K} - 0.5\right)\right\}} & T - K \leq I(x) \leq T \end{cases}.$$

12. The signal processing apparatus according to claim 1, wherein the circuitry or at least one processor further acts as a display control unit configured to cause a display apparatus to display the result of the predetermined stochastic resonance processing executed by the stochastic resonance processing unit.

13. A signal processing apparatus comprising:
circuitry or at least one processor, configured to act as a plurality of units comprising:
(1) an acquisition unit configured to acquire input data;
(2) a unit configured to generate noise cut data by deducting uniformly a predetermined fixed value from values of respective signals of the input data;
(3) a stochastic resonance processing unit configured to subject the input data to a predetermined stochastic resonance processing to subsequently multiply the noise cut data to thereby generate stochastic resonance data; and
(4) an output unit configured to output the result of the predetermined stochastic resonance processing,
wherein the predetermined stochastic resonance processing is processing to output, in a method of adding different noises to the same input data and performing binary processing in a plurality of branch paths respectively, a convergence value obtained in a case where a parallel number is increased,
wherein the predetermined stochastic resonance processing is performed by using the following formula to calculate processed data J(x) from the input data I(x):

$$J(x) = \begin{cases} 1 & T < I(x) \\ 0 & I(x) < T - K \\ 1 - (T - I(x))/K & T - K \leq I(x) \leq T \end{cases}$$

where T is a threshold value to quantize the input data and K is a noise strength, or the predetermined stochastic resonance processing is performed by using the following formula to calculate processed data J(x) from the input data I(x), $$J(x) = \begin{cases} 1 & T < I(x) \\ 0 & I(x) < T - K \\ 1 - \dfrac{1}{1 + \exp\left\{-\alpha\left(\dfrac{(T - I(x))}{K} - 0.5\right)\right\}} & T - K \leq I(x) \leq T \end{cases}$$

where T is a threshold value to quantize the input data and K is a noise strength.

14. A signal processing method comprising:
an acquisition step of acquiring input data;
a step of generating noise cut data by deducting uniformly a predetermined fixed value from values of respective signals of the input data;
a stochastic resonance processing step of subjecting the noise cut data to a predetermined stochastic resonance processing to thereby generate stochastic resonance data; and
an output step of outputting the result of the predetermined stochastic resonance processing,
wherein the predetermined stochastic resonance processing is a processing to output, in a method of adding different noises to the same noise cut data and performing binary processing in a plurality of branch paths respectively, a convergence value obtained in a case where a parallel number is increased,
wherein the predetermined stochastic resonance processing is performed by using the following formula to calculate processed data J(x) from the input data I(x):

$$J(x) = \begin{cases} 1 & T < I(x) \\ 0 & I(x) < T - K \\ 1 - (T - I(x))/K & T - K \leq I(x) \leq T \end{cases}$$

where T is a threshold value to quantize the input data and K is a noise strength,
or the predetermined stochastic resonance processing is performed by using the following formula to calculate processed data J(x) from the input data I(x):

$$J(x) = \begin{cases} 1 & T < I(x) \\ 0 & I(x) < T - K \\ 1 - \dfrac{1}{1 + \exp\left\{-\alpha\left(\dfrac{(T - I(x))}{K} - 0.5\right)\right\}} & T - K \leq I(x) \leq T \end{cases}$$

where T is a threshold value to quantize the input data and K is a noise strength.

15. A non-transitory computer-readable storage medium which stores a program for causing a computer to execute a signal processing method, the signal processing method comprising:
an acquisition step of acquiring input data;
a step of generating noise cut data by deducting uniformly a predetermined fixed value from values of respective signals of the input data;
a stochastic resonance processing step of subjecting the noise cut data to a predetermined stochastic resonance processing to thereby generate stochastic resonance data; and
an output step of outputting the result of the predetermined stochastic resonance processing,
wherein the predetermined stochastic resonance processing is a processing to output, in a method of adding different noises to the same noise cut data and performing binary processing in a plurality of branch paths respectively, a convergence value obtained in a case where a parallel number is increased,
wherein the predetermined stochastic resonance processing is performed by using the following formula to calculate processed data J(x) from the input data I(x):

$$J(x) = \begin{cases} 1 & T < I(x) \\ 0 & I(x) < T - K \\ 1 - (T - I(x))/K & T - K \leq I(x) \leq T \end{cases}$$

where T is a threshold value to quantize the input data and K is a noise strength,
or the predetermined stochastic resonance processing is performed by using the following formula to calculate processed data J(x) from the input data I(x):

$$J(x) = \begin{cases} 1 & T < I(x) \\ 0 & I(x) < T - K \\ 1 - \dfrac{1}{1 + \exp\left\{-\alpha\left(\dfrac{(T - I(x))}{K} - 0.5\right)\right\}} & T - K \leq I(x) \leq T \end{cases}$$

where T is a threshold value to quantize the input data and K is a noise strength.

* * * * *